(12) United States Patent
Mizutani et al.

(10) Patent No.: US 6,808,869 B1
(45) Date of Patent: Oct. 26, 2004

(54) BOTTOM ANTI-REFLECTIVE COATING MATERIAL COMPOSITION AND METHOD FOR FORMING RESIST PATTERN USING THE SAME

(75) Inventors: Kazuyoshi Mizutani, Shizuoka (JP); Makoto Momota, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/615,708

(22) Filed: Jul. 13, 2000

Related U.S. Application Data

(62) Division of application No. 08/997,393, filed on Dec. 23, 1997, now Pat. No. 6,165,684.

(30) Foreign Application Priority Data

Dec. 24, 1996 (JP) ............................................. 8-343738
Feb. 28, 1997 (JP) ............................................. 9-046001

(51) Int. Cl.[7] ............................ G03F 7/11; G03F 7/38; G03F 7/40
(52) U.S. Cl. ...................... 430/325; 430/326; 430/330; 430/271.1; 525/154; 525/509; 525/472; 525/480; 525/155; 526/256; 526/284; 526/281
(58) Field of Search ................................ 525/154, 509, 525/472, 480, 155; 526/256, 284, 281; 430/325, 326, 330, 271.1

(56) References Cited

U.S. PATENT DOCUMENTS 2,716,097 A * 8/1955 Unruh et al. ............... 525/154
2,716,103 A * 8/1955 Unruh et al. ............... 525/154
3,575,925 A    4/1971 Skoultchi .................... 526/284
3,943,108 A * 3/1976 Teuscher ..................... 525/154
4,473,690 A * 9/1984 Yuki et al. ................... 526/265
4,614,703 A    9/1986 Guillet ....................... 430/271.1
5,401,614 A    3/1995 Dichiara et al. ............ 430/323
5,403,908 A * 4/1995 Watanabe et al. ........... 526/284
5,475,061 A * 12/1995 Machida et al. ............ 525/247
5,554,485 A * 9/1996 Dichiara et al. ........ 430/271.1
5,693,691 A    12/1997 Flaim et al. ............. 430/271.1
5,919,599 A    7/1999 Meador et al. .......... 430/271.1
5,994,430 A * 11/1999 Ding et al. .................. 526/288
6,090,531 A * 7/2000 Mizutani et al. ............ 430/325

OTHER PUBLICATIONS

Gevorgyan et al, "An Efficient Route to 2,6—Disubstituted Styrenes via the Palladium–Catalyzed [4 + 2] Cyclodimerization of Conjugated Enynes", Journal of Organic Chemistry, vol. 63, published on Web Sep. 12, 1998, pp. 7022–7025.*

Morrison et al, Organic Chemistry, Allyn and BAcon, Inc., New York, N.Y. 1973, p. 318.*

* cited by examiner

*Primary Examiner*—Cynthia Hamilton
(74) *Attorney, Agent, or Firm*—Sughrue Mion, PLLC

(57) ABSTRACT

A composition for a bottom anti-reflective coating material and a method for forming a resist pattern using the composition, which are high in the dry etching rate, high in the resolution, excellent in the resist film thickness dependency and high in the effect of preventing reflective light against exposure light, and provide no intermixing with the photoresist layer, are disclosed, wherein the composition for a bottom anti-reflective coating material comprises a naphthalene group-containing polymer compound having a specific structure.

8 Claims, No Drawings

BOTTOM ANTI-REFLECTIVE COATING MATERIAL COMPOSITION AND METHOD FOR FORMING RESIST PATTERN USING THE SAME

This is a divisional of application Ser. No. 08/997,393 filed Dec. 23, 1997, now U.S. Pat. No. 6,165,684, the disclosure of which is incorporated herein by reference.

FIELD OF THE INVENTION

The present invention relates to a composition for a bottom anti-reflective coating material, which is effective in reducing the adverse effect of the reflection from the background substrate in the lithography process using various radiations, and to a method for forming a resist pattern using this composition for a bottom anti-reflective coating material.

BACKGROUND OF THE INVENTION

A photoresist is coated on a substrate such as semiconductor wafer, glass, ceramic or metal to have a thickness of from 0.5 to 2 µm by a spin coating method or a roller coating method and thereafter subjected to heating, drying, printing of a circuit pattern through an exposure mask with radiation such as ultraviolet ray, post exposure baking if desired, and development to form an image.

This image as a mask is etched so as to effect pattern working on the substrate. Representative examples of the application field thereof include the production process of semiconductors such as IC, the production of circuit substrates such as liquid crystal and thermal head and other photofabrication process.

In the semiconductor fine working using a photoresist, accompanying the tendency towards finer dimensions, a matter of great importance is the prevention of light reflection from the substrate. For this purpose, a photoresist containing a light absorbent has been conventionally used, however, the use has a problem that the resolution is impaired. Accordingly, a method of providing a bottom anti-reflective coating (BARC) between the photoresist and the substrate has been broadly investigated. Known examples of the bottom anti-reflective coating are an inorganic coating type such as titanium, titanium dioxide, titanium nitride, chromium oxide, carbon and α-silicon, and an organic coating type comprising a light absorbent and a polymer material. The former requires equipments such as a vacuum evaporation apparatus, a CVD apparatus and a sputtering apparatus, for the coating formation. The latter does not require any particular equipment advantageously and a large number of studies are being made thereon. For example, JP-B-7-69611 (the term "JP-B" as used herein means an "examined Japanese patent publication") describes a coating comprising a condensate of a diphenylamine derivative with a formaldehyde-modified melamine resin, an alkali-soluble resin and a light absorbent, U.S. Pat. No. 5,294,680 describes a reaction product of a maleic anhydride copolymer with a diamine-type light absorbent, JP-A-6-118631 (the term "JP-A" as used herein means an "unexamined published Japanese patent application") describes a coating comprising a resin binder and a methylolmelamine-base heat cross-linking agent, JP-A-6-118656 describes an acrylic resin-type anti-reflective coating containing within the same molecule a carboxylic acid group, an epoxy group and a light absorbing group, JP-A-8-87115 describes a coating comprising methylolmelamine and a benzophenone-base light absorbent, and JP-A-8-179509 describes a coating obtained by adding a low molecular light absorbent to a polyvinyl alcohol resin.

The material for organic bottom anti-reflective coating preferably has physical properties such that it exhibits a large absorbance to radiations, it is insoluble in the photoresist solvent (not to cause intermixing with the photoresist layer), it is free from dispersion of a low molecular substance from the anti-reflective coating material to the overcoat photoresist layer during the coating or drying by heating, and it has a high dry etching rate as compared with the photoresist. These are also described, for example, in Proc. SPIE, Vol. 2195, 225–229 (1994).

However, the compounds described in the above-described patent publications fail to satisfy all these requirements and improvements have been demanded. For example, some conventional bottom anti-reflective coatings are insufficient in the light absorbing power of the binder and require separate loading of a light absorbent, and some contain a large amount of an aromatic light absorbent for increasing the absorbance but has a problem that the dry etching rate is low. Further, those having, in the cross-linking system, a functional group capable of increasing the alkali permeability such as a carboxylic acid group, are bound to a problem that when development with an alkaline aqueous solution is performed, the anti-reflective coating swells to incur the worsening of the resist pattern shape.

SUMMARY OF THE INVENTION

An object of the present invention is to provide a composition for a bottom anti-reflective coating material, which has large light absorbance, can form excellent resist pattern-with high resolution and low film thickness dependency, and shows high dry etching rate.

Another object of the present invention is to provide a method for forming a resist pattern, which is high in the dry etching rate and can form an excellent resist pattern having excellent light absorbance with high resolution and low film thickness dependency.

Still another object of the present invention is to provide a photoresist bottom anti-reflective coating material composition having high effect of preventing reflective light of the exposure light (particularly, light at a wavelength of 248 nm) on the photoresist, substantially free of intermixing with the photoresist layer, causing no dispersion into the photoresist layer on drying by heating, having a high dry etching rate as compared with the photoresist, and capable of forming a resist pattern with high resolution and low film thickness dependency.

Still further object of the present invention is to provide a method for forming a resist pattern, which has high effect of preventing reflective light of the exposure light (particularly, light at a wavelength of 248 nm) on the photoresist, is substantially free of intermixing with the photoresist layer, causes no dispersion into the photoresist layer on drying by heating, has a high dry etching rate as compared with the photoresist, and can form a resist pattern with high resolution and low film thickness dependency.

These objects of the present invention can be attained by the following constructions:

(1) a composition for a bottom anti-reflective coating material, comprising a polymer compound having a structure represented by the following formula (I) or (II) on the side chain:

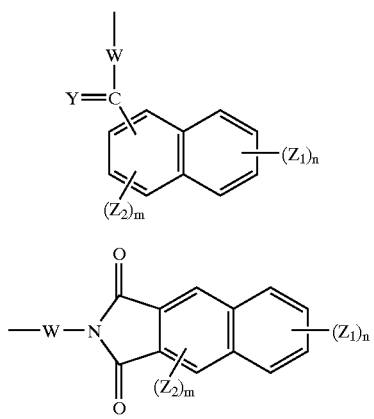

(I)

(II)

wherein W represents a linking group to the polymer main chain, Y represents an oxygen atom, a sulfur atom or =N—V, $Z_1$ and $Z_2$, which may be the same or different, each represents an electron donating group, m and n represent an integer of from 0 to 2 and from 0 to 3, respectively, and when m and n each is 2 or 3, the $Z_1$ groups or the $Z_2$ groups may be the same or different, and V represents —OH, —NH$_2$, a linear, branched or cyclic alkyl group having from 1 to 20 carbon atoms, wherein the alkyl group may have a substituent, an aromatic or heterocyclic or heteroaromatic ring group having from 5 to 14 carbon atoms, which may have a substituent, or an alkoxy group having from 1 to 20 carbon atoms;

(2) a composition for a bottom anti-reflective coating material, comprising a polymer compound having a structure represented by the following formula (III) or (IV) as a part of the repeating unit on the main or side chain:

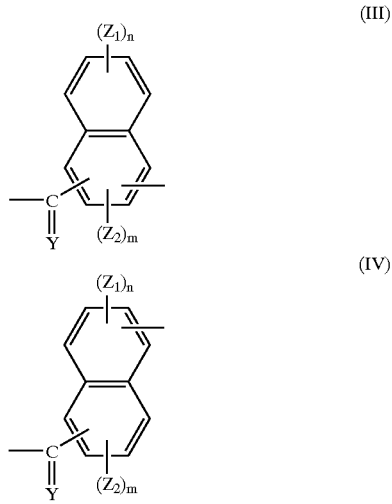

(III)

(IV)

wherein Y represents an oxygen atom, a sulfur atom or =N—V, $Z_1$ and $Z_2$, which may be the same or different, each represents an electron donating group, m and n represent an integer of from 0 to 2 and from 0 to 3, respectively, and when m and n each is 2 or 3, the $Z_1$ groups or the $Z_2$ groups may be the same or different, and V represents —OH, —NH$_2$, a linear, branched or cyclic alkyl group having from 1 to 20 carbon atoms wherein the alkyl group may have a substituent, an aromatic or heteroaromatic ring group having from 5 to 14 carbon atoms, which may have a substituent, or an alkoxy group having from 1 to 20 carbon atoms;

(3) a composition for a bottom anti-reflective coating material, comprising a polymer compound having a repeating unit of the structure represented by formula (V) or (VI):

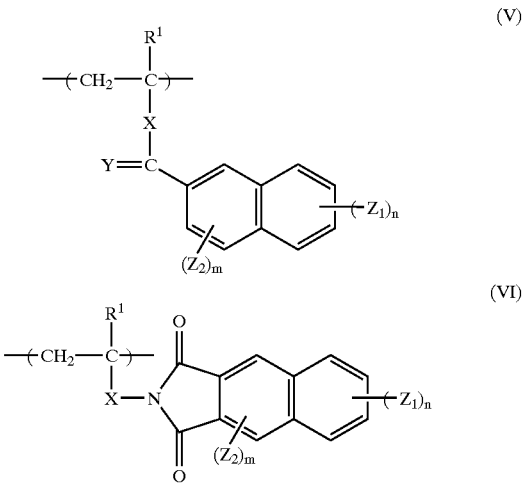

(V)

(VI)

wherein $R^1$ represents a hydrogen atom, a methyl group, a chlorine atom, a bromine atom or a cyano group, X represents a divalent linking group, Y, $Z_1$, $Z_2$, m and n have the same meanings as defined in item (1), and when m and n each is 2 or 3, the $Z_1$ groups or the $Z_2$ groups may be the same or different;

(4) a composition for a bottom anti-reflective coating material as described in item (3), wherein in formula (V) or (VI), $Z_1$ and $Z_2$ each is a group selected from —OH, —OR$^4$, —NR$^5$R$^6$ and —SR$^4$ wherein $R^4$ represents a hydrocarbon group having from 1 to 20 carbon atoms, and $R^5$ and $R^6$, which may be the same or different, each represents a hydrogen atom or a hydrocarbon group having from 1 to 20 carbon atoms;

(5) a composition for a bottom anti-reflective coating material, comprising the following components (a) and (b):

(a) a polymer compound having a structure represented by formula (I) or (II) described in item (1); and (b) a melamine, guanamine, glycoluril or urea compound substituted by at least one substituent selected from a methylol group, an alkoxymethyl group and an acyloxymethyl group;

(6) a composition for a bottom anti-reflective coating material as described in item (5), wherein in formula (I) or (II), W is a single bond or a linking group containing a group selected from an alkylene group which may have a substituent, an arylene group which may have a substituent and an aralkylene group which may have a substituent wherein W may have one or more of —CO$_2$—, —CONH—, —O—, —CO— and —SO$_2$— in the middle thereof, and $Z_1$ and $Z_2$ each is a group selected from —OH, —OR$^4$, —SR$^4$ and —NR$^5$R$^6$ wherein $R^4$ represents a hydrocarbon group having from 1 to 20 carbon atoms, and $R^5$ and $R^6$, which may be the same or different, each represents a hydrogen atom or a hydrocarbon group having from 1 to 20 carbon atoms, and when m and n each is 2 or 3, the $Z_1$ groups or the $Z_2$ groups may be the same or different;

(7) a composition for a bottom anti-reflective coating material comprising the following components (a) and (c):

(a) a polymer compound having a structure represented by formula (I) or (II) described in item (1); and (c) a phenol, naphthol or hydroxyanthracene compound substituted by two or more groups selected from a methylol group, an alkoxymethyl group and an acyloxymethyl group;

(8) A composition for a bottom anti-reflective coating material as described in item (7), wherein in formula (I) or (II), W is a single bond or a linking group containing a group selected from an alkylene group which may have a substituent, an arylene group which may have a substituent and an aralkylene group which may have a substituent wherein W may have one or more of $-CO_2-$, $-CONH-$, $-O-$, $-CO-$ and $-SO_2-$ in the middle thereof, and $Z_1$ and $Z_2$ each is a group selected from $-OH$, $-OR^4$, $-SR^4$ and $-NR^5R^6$ wherein $R^4$ represents a hydrocarbon group having from 1 to 20 carbon atoms, and $R^5$ and $R^6$, which may be the same or different, each represents a hydrogen atom or a hydrocarbon group having from 1 to 20 carbon atoms, and when m and n each is 2 or 3, the $Z_1$ groups or the $Z_2$ groups may be the same or different;

(9) a composition for a bottom anti-reflective coating material as described in item (1), wherein the polymer compound having a structure represented by formula (I) or (II) contains from 2 to 50 wt % of a repeating structural unit represented by the following formula (VII):

(VII)

wherein $R^2$ represents a hydrogen atom, a methyl group, a chlorine atom, a bromine atom or a cyano group, and A represents an organic functional group having a $-CH_2OH$, $-CH_2OR^4$ or $-CH_2OCOCH_3$ terminal group wherein $R^4$ represents a hydrocarbon group having from 1 to 20 carbon atoms;

(10) a composition for a bottom anti-reflective coating material as described in item (9), wherein A in formula (VII) is a group resulting from the reaction of $-CONHCH_2OH$, $-CONHCH_2OCH_3$, $-C_6H_4CH_2OH$, $-C_6H_4CH_2OCH_3$ or $-CONHC(CH_3)_2CHCOCH_3$ with formalin;

(11) a composition for a bottom anti-reflective coating material as described in item (1), wherein the polymer compound having a structure represented by formula (I) or (II) contains from 2 to 30 wt % of a repeating structural unit represented by the following formula (VIII):

(VIII)

wherein $R^2$ has the same meaning as $R^2$ in item (9), and B represents an organic functional group having an epoxy terminal group;

(12) a bottom anti-reflective coating material composition comprising a polymer light absorbent having at least one group represented by the following formula (IX), (X), (XI), (XII), (XIII), (XIV) or (XV) on the side chain:

(IX)

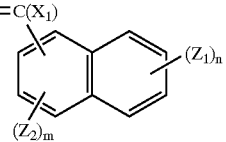
(X)

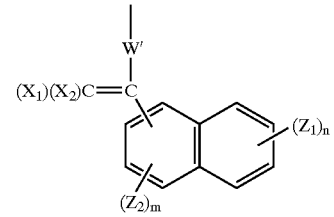
(XI)

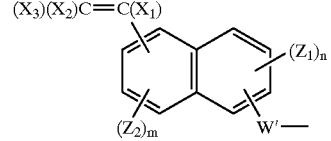
(XII)

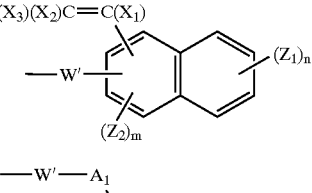
(XIII)

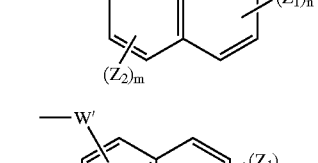
(XIV)

(XV)

wherein W' represents a divalent linking group, $X_1$ to $X_3$, which may be the same or different, each represents a hydrogen atom, a halogen atom, a cyano group or $-(X_4)_p-R$ wherein R represents an alkyl group having from 1 to 20 carbon atoms, an aryl group having from 6 to 20 carbon toms or an aralkyl group having from 7 to 20 carbon atoms, which may have a substituent, $X_4$ represents a single bond, $-CO_2-$, $-CONH-$, $-O-$, $-CO-$, an alkylene group having from 2 to 4 carbon atoms or $-SO_2-$, p represents an integer of from 1 to 10, $Z_1$ and $Z_2$, which may be the same or different, each represents an electron donating group, m and n represent an integer of from 0 to 2 and from 0 to 3, respectively, and when m is 2 or m and n each is 2 or 3, the $Z_1$ groups or the $Z_2$ groups may be the same or different, $A_1$ represents a divalent aromatic ring or heteroaromatic ring group having from 5 to 14 carbon atoms, which may have a substituent, and $A_2$ represents an aromatic ring or heteroaromatic ring group having from 5 to 14 carbon atoms, which may have a substituent;

(13) a bottom anti-reflective coating material composition comprising a polymer light absorbent having at least one structure represented by the following formula (XVI), (XVII), (XVIII), (XIX), (XX), (XXI), (XXII) or (XXIII) as at least a part of the repeating unit on the main or side chain:

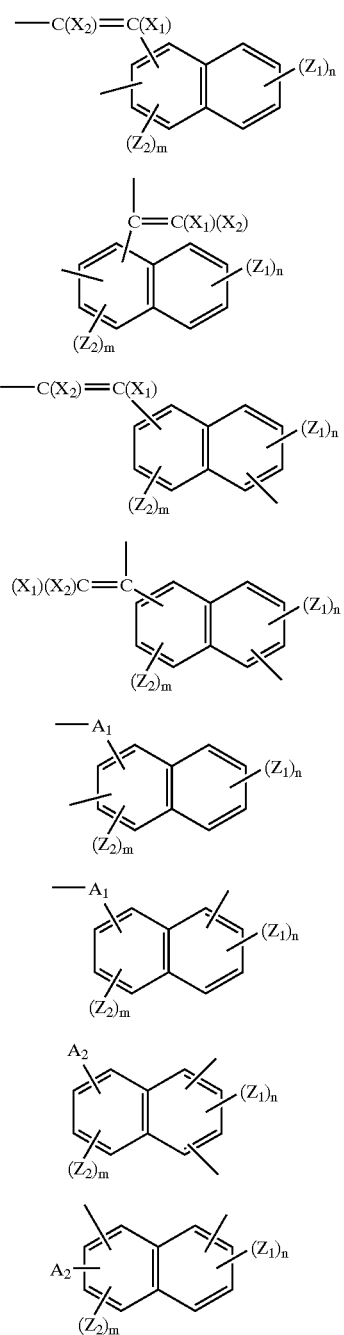

wherein $X_1$ to $X_3$, $Z_1$, $Z_2$, $A_1$, $A_2$, n and m each has the same meaning as defined in item (12);

(14) a bottom anti-reflective coating material composition comprising a polymer light absorbent having at least one repeating structural unit represented by the following formula (XXIV), (XXV) or (XXVI):

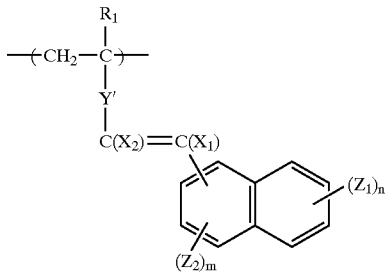

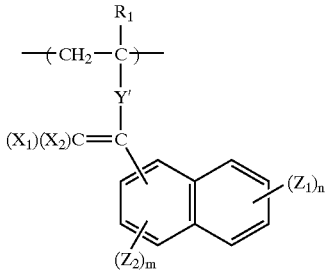

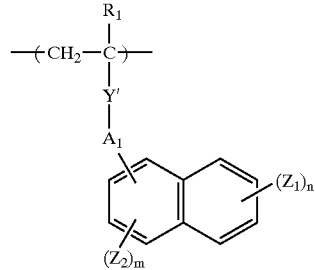

wherein $R^1$ represents a hydrogen atom, a methyl group, a chlorine atom, a bromine atom or a cyano group, Y' represents a divalent linking group, $X_1$, $X_2$, $Z_1$, $Z_2$, m, n and $A_1$ each has the same meaning as in item (12);

(15) a bottom anti-reflective coating material composition as described in item (14), wherein Y' is a single bond, an alkylene, arylene or aralkylene group which may partially have one or more of —$CO_2$—, —CONH—, —O—, —CO— and —$SO_2$—, or a group represented by —$CO_2$—E—, —CONH—E—, —O—E—, —CO—E— or —$SO_2$—E—group wherein E represents a single bond or an aromatic ring group having from 6 to 14 carbon atoms, which may have a substituent;

(16) a bottom anti-reflective coating material composition as described in any one of items (12) to (15), wherein $Z_1$ and $Z_2$, which may be the same or different, each represents —OH, —$OR^4$, —$NR^5R^6$ or —$SR^4$ wherein $R^4$ represents a hydrocarbon group having from 1 to 20 carbon atoms, and $R^5$ and $R^6$ each represents a hydrogen atom or a hydrocarbon group having from 1 to 20 carbon atoms;

(17) a bottom anti-reflective coating material composition as described in any one of items (12) to (16), wherein $A_1$ and $A_2$ each represents a divalent or monovalent group of benzene, naphthalene, anthracene, phenanthrene or thiophene ring, which may have a substituent;

(18) a bottom anti-reflective coating material composition as described in any one of items (12) to (17), wherein said polymer light absorbent contains from 2 to 50 wt % of the repeating structural unit represented by the following formula (XXVII):

(XXVII)

wherein $R^2$ represents a hydrogen atom, a methyl group, a chlorine atom, a bromine atom or a cyano group, and $B_1$ represents an organic functional group having —$CH_2OH$, —$CH_2OR^7$ or —$CH_2OCOCH_3$ at the terminal wherein $R^7$ represents a hydrocarbon group having from 1 to 20 carbon atoms;

(19) a bottom anti-reflective coating material composition as described in any one of items (12) to (17), wherein said polymer light-absorbent contains from 2 to 50 wt % of a repeating structural unit represented by formula (XXVII) of item (18) where $B_1$ is a group obtained by the reaction of a group represented by —$CONHCH_2OH$, —$CONHCH_2OCH_3$, —$CH_2OCOCH_3$, —$C_6H_4(OH)CH_2OH$, —$C_6H_4(OH)CH_2OCH_3$ or —$CONHC(CH_3)_2CH_2COCH_3$, with formalin;

(20) a bottom anti-reflective coating material composition as described in any one of items (12) to (17), wherein said polymer light absorbent contains from 2 to 30 wt % of a repeating structural unit represented by the following formula (XXVIII):

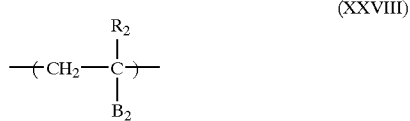

(XXVIII)

wherein $R^2$ represents a hydrogen atom, a methyl group, a chlorine atom, a bromine atom or a cyano group, and $B_2$ represents an organic functional group having an epoxy terminal group;

(21) a bottom anti-reflective coating material composition comprising the following components (a) and (b):
(a) a polymer light absorbent described in any one of items (12) to (20); and
(b) a melamine, guanamine, glycoluril or urea compound substituted by at least one substituent selected from a methylol group, an alkoxymethyl group and an acyloxymethyl group;

(22) a bottom anti-reflective coating material composition comprising the following components (a) and (c):
(a) a polymer light absorbent described in any one of items (12) to (20); and
(c) a phenol, naphthol or hydroxyanthracene compound substituted by at least one substituent selected from a methylol group, an alkoxymethyl group and an acyloxymethyl group; and

(23) a method for forming a resist pattern, which uses a bottom anti-reflective coating material composition described in any one of items (2) to (22).

DETAILED DESCRIPTION OF THE INVENTION

In formulae (I), (III) and (IV), the —C(=Y)— group linking to the naphthalene group is preferably bonded to the β-position of the naphthalene ring so as to match with the wavelength (248 nm) of KrF excimer laser.

The linking group represented by W or X is a single bond or a linking group containing a group selected from an alkylene group which may have a substituent, an arylene group which may have a substituent and an aralkylene group which may have a substituent (W and X each may have one or more of —$CO_2$—, —$CONH$—, —$O$—, —$CO$— and —$SO_2$— in the middle thereof).

Examples of the alkylene group which may have a substituent include a linear alkylene chain having from 1 to 20 carbon atoms which may have a substituent (preferably an alkyl group having from 1 to 10 carbon atoms, —OH, —$OR^4$, —$SR^4$, —$NR^5R^6$ or a halogen group) (the linear alkylene chain may have one or more of —$CO_2$—, —$CONH$—, —$O$—, —$CO$— and —$SO_2$— in the middle thereof), a branched alkylene chain having from 1 to 20 carbon atoms, which may have a substituent, and an alkylene chain having from 1 to 20 carbon atoms, which may have a cyclic alkylene structure in the middle thereof.

Examples of the arylene group which may have a substituent include an arylene group having from 6 to 14 carbon atoms which may have a substituent (preferably an alkyl group having from 1 to 10 carbon atoms, —OH, —$OR^4$, —$SR^4$, —$NR^5R^6$ or a halogen group) (the arylene group may have one or more of —$CO_2$—, —$CONH$—, —$O$—, —$CO$— and —$SO_2$— in the middle thereof).

Examples of the aralkylene group which may have a substituent include an aralkylene group having from 7 to 15 carbon atoms which may have a substituent (preferably an alkyl group having from 1 to 10 carbon atoms, —OH, —$OR^4$, —$SR^4$, —$NR^5R^6$ or a halogen group) (the aralkylene group may have one or more of —$CO_2$—, —$CONH$—, —$O$—, —$CO$— and —$SO_2$— in the middle thereof).

The linking group represented by W or X is preferably a single bond, —$CO_2$, —$CONH$—, —$O$—, —$CO$—, —$SO_2$—, a linear alkylene chain having from 1 to 20 carbon atoms, which may have a substituent (preferably an alkyl group having from 1 to 10 carbon atoms, —OH, —$OR^4$, —$SR^4$, —$NR^5R^6$ or a halogen group) (the linear alkylene chain may have one or more of —$CO_2$—, —$CONH$—, —$O$—, —$CO$— and —$SO_2$— in the middle thereof), a branched alkylene chain having from 1 to 20 carbon atoms, which may have a substituent, or an alkylene chain having from 1 to 20 carbon atoms, which may have a cyclic alkylene structure in the middle thereof. In the groups above, $R^4$ represents an alkyl group having from 1 to 20 carbon atoms, and $R^5$ and $R^6$ each represents a hydrogen atom or an alkyl group having from 1 to 20 carbon atoms.

$Z_1$ and $Z_2$ each represents an electron donating group. The electron donating group means a group having a Hammett's substituent constant $\sigma_p$ of a negative value. $Z_1$ and $Z_2$ each is preferably —OH, —$OR^4$, —$SR^4$ or —$NR^5R^6$ (wherein $R^4$ represents an alkyl group having from 1 to 20 carbon atoms, and $R^5$ and $R^6$ each represents a hydrogen atom or an alkyl group having from 1 to 20 carbon atoms).

$R^4$, $R^5$ and $R^6$ each is preferably a methyl group, an ethyl group, an n-propyl group, an i-propyl group, an n-butyl group, an i-butyl group, a t-butyl group, an n-pentyl group, an n-hexyl group, a cyclohexyl group, an n-octyl group, a 2-ethylhexyl group, an n-nonyl group, an n-decyl group, an n-lauryl group or an n-stearyl group, and in view of no reduction in the dry etching rate, more preferably a non-cyclic hydrocarbon group having from 1 to 6 carbon atoms such as methyl, ethyl, n-propyl, i-propyl, n-butyl, i-butyl, t-butyl, n-pentyl and n-hexyl, a 2-hydroxyethyl group, an allyl group, a 2,3-dichloropropyl group or a 2,3-dibromopropyl group.

Y represents an oxygen atom, a sulfur atom or =N—V (wherein V represents a hydroxyl group, an amino group, a linear, branched or cyclic alkyl group having from 1 to 20 carbon atoms, which may have a-substituent, an aromatic or heteroaromatic ring group having from 5 to 14 carbon atoms, which may have a substituent, or an alkoxy group having from 1 to 20 carbon atoms).

Examples of the linear, branched or cyclic alkyl group having from 1 to 20 carbon atoms, which may have a substituent, include a methyl group, an ethyl group, a n-propyl group, an i-propyl group, an n-butyl group, an i-butyl group, a t-butyl group, an n-pentyl group, an n-hexyl group, a cyclohexyl group, an n-octyl group, a 2-ethylhexyl group, an n-nonyl group, an n-decyl group, an n-lauryl group and an n-stearyl group.

Examples of the aromatic or heteroaromatic ring group having from 5 to 14 carbon atoms, which may have a substituent, include a pyrrole group, a phenyl group, a tolyl group, a naphthyl group, a phenanthrene group and an anthracene group.

Examples of the alkoxy group having from 1 to 20 carbon atoms include a methoxy group, an ethoxy group, an n-propoxy group, an i-propoxy group, an n-butoxy group, an i-butoxy group, a t-butoxy group, n-pentoxy group, a methoxycarbonylmethyloxy group and an ethoxycarbonylmethyloxy group.

Y is preferably an oxygen atom or a sulfur atom.

The polymer compound of the present invention may be copolymerized with a non-cross-linking monomer other than the repeating unit having a structure represented by formula (I) or (II) and thereby, the dry etching rate, the reflectivity or the like can be delicately controlled.

Examples of the copolymerizable monomer include compounds having one addition-polymerizable unsaturated bond selected from an acrylic ester, an acrylamide, a methacrylic ester, a methacrylamide, an allyl compound, a vinyl ether, a vinyl ester, a styrene and a crotonic ester. Specific examples thereof include:

acrylic esters such as alkyl acrylate (the alkyl group preferably has from 1 to 10 carbon atoms) (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate) and aryl acrylate (e.g., phenyl acrylate, hydroxyphenyl acrylate);

methacrylic esters such as alkyl methacrylate (the alkyl group preferably has from 1 to 10 carbon atoms) (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylol propane monomethacrylate, pentaerythritol monomethacrylate, furfuryl methacrylate, tetrahydrofurfuryl methacrylate) and aryl methacrylate (e.g., phenyl methacrylate, hydroxyphenyl methacrylate, cresyl methacrylate, naphthyl methacrylate);

acrylamides such as acrylamide, N-alkylacrylamide (the alkyl group has from 1 to 10 carbon atoms and examples thereof include a methyl group, an ethyl group, a propyl group, a butyl group, a t-butyl group, a heptenyl group, an octyl group, a cyclohexyl group, a benzyl group, a hydroxyethyl group and a benzyl group), N-arylacrylamide (examples of the aryl group include a phenyl group, a tolyl group, a nitrophenyl group, a naphthyl group, a cyanophenyl group, a hydroxyphenyl group and a carboxyphenyl group), N,N-dialkylacrylamide (the alkyl group has from 1 to 10 carbon atoms and examples thereof include a methyl group, an ethyl group, a butyl group, an isobutyl group, an ethylhexyl group and a cyclohexyl group), N,N-arylacrylamide (examples of the aryl group include a phenyl group), N-methyl-N-phenylacrylamide, N-hydroxyethyl-N-methylacrylamide and N-2-acetoamidoethyl-N-acetylacrylamide;

methacrylamides such as methacrylamide, N-alkylmethacrylamide (the alkyl group has from 1 to 10 carbon atoms and examples thereof include a methyl group, an ethyl group, a t-butyl group, an ethylhexyl group, a hydroxyethyl group and a cyclohexyl group), N-arylmethacrylamide (examples of the aryl group include a phenyl group, a hydroxyphenyl group and a carboxyphenyl group), N,N-dialkylmethacrylamide (examples of the alkyl group include an ethyl group, a propyl group and a butyl group), N,N-diarylmethacrylamide (examples of the aryl group include a phenyl group), N-hydroxyethyl-N-methylmethacrylamide, N-methyl-N-phenylmethacrylamide and N-ethyl-N-phenylmethacrylamide;

allyl compounds such as an allyl ester (e.g., allyl acetate, allyl caproate, allyl caprylate, allyl laurate, allyl palmitate, allyl stearate, allyl benzoate, allyl acetoacetate, allyl lactate) and allyloxyethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), vinylaryl ether (e.g., vinylphenyl ether, vinyltolyl ether, vinylchlorophenyl ether, vinyl-2,4-dichlorophenyl ether, vinylnaphthyl ether, vinylanthranyl ether);

vinyl esters such as vinyl butyrate, vinyl iso-butyrate, vinyltrimethyl acetate, vinyldiethyl acetate, vinyl valerate, vinyl caproate, vinyl chloroacetate, vinyl dichloroacetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethyl-styrene, trifluoromethylstyrene, ethoxymethyl styrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethyl styrene), hydroxystyrene (e.g., 4-hydroxystyrne, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl) styrene and carboxystyrene;

crotonic acid esters such as alkyl crotonate (e.g., butyl crotonate, hexyl crotonate, glycerol monocrotonate), dialkyl itaconates (e.g., dimethyl itaconate, diethyl itaconate, dibutyl itaconate);

dialkyl esters of maleic acid or fumaric acid (e.g., dimethyl maleate, dibutyl fumarate) or monoalkyl esters of maleic acid or fumaric acid;

an acrylic acid, a methacrylic acid, a crotonic acid, an itaconic acid, a maleic anhydride, a maleimide, an acrylonitrile, a methacrylonitrile and a maleylonitrile. In addition, an addition polymerizable unsaturated compound capable of copolymerization with the repeating structural unit for use in the present invention may be used.

Among these, in view of the capability of intensifying the heat cross-linking property of the polymer compound, for example, 2-hydroxyethyl (meth)acrylate, 2-hydroxypropyl (meth)acrylate, ethylene glycol mono(meth)acrylate, polyethylene glycol mono(meth)acrylate, propylene glycol mono(meth)acrylate, polypropylene glycol mono(meth) acrylate and their corresponding (meth)acrylamide monomer, vinyl alcohol, hydroxystyrene and hydroxymethylstyrene are preferred.

From the standpoint that good solvent solubility of the polymer can be kept without reducing the dry etching rate, an alkyl (meth)acrylate monomer having an alkyl chain having from 1 to 10 carbon atoms is also preferred.

The polymer compound in the composition for a bottom anti-reflective coating material of the present invention may have a cross-linking group in the polymer chain thereof. Examples thereof include those resulting from the copolymerization of the repeating structural unit having a cross-linking group represented by formula (VII) or (VIII).

In formulae (VII) and (VIII), $R^2$ represents a hydrogen atom, a methyl group, a chlorine atom, a bromine atom or a cyano group, and A represents an organic function group having a —$CH_2OH$, —$CH_2OR^4$ or —$CH_2OCOCH_3$ terminal group (wherein $R^4$ represents a hydrocarbon group having from 1 to 20 carbon atoms). A is preferably a group resulting from the reaction of —$CONHCH_2OH$, —$CONHCH_2OCH_3$, —$C_6H_4CH_2OH$, —$C_6H_4CH_2OCH_3$ or —$CONHC(CH_3)_2CHCOCH_3$, with formalin.

B represents an organic functional group having an epoxy terminal group, preferably a group shown below:

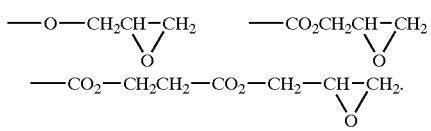

In the polymer compound for use in the present invention, the content of the repeating structural unit having a structure represented by formula (I) or (II) is from to 99 wt %, preferably from 30 to 97 wt %, more preferably from 50 to 95 wt %.

In the polymer compound for use in the present invention, the content of the repeating structural unit having a cross-liking group represented by formula (VII) or (VIII) is preferably from 2 to 50 wt %, more preferably from 5 to 30 wt %, based on all repeating units.

In the polymer compound for use in the present invention, the content of the repeating unit other than the repeating structural unit represented by formula (I) or (II) and the repeating structural unit having a cross-linking group represented by formula (VII) or (VIII), is preferably from 0 to 80 wt %, more preferably from 20 to 70 wt %, based on all repeating units.

Specific examples of the polymer compound for use in the present invention are set forth below, however, the present invention is by no means limited thereto.

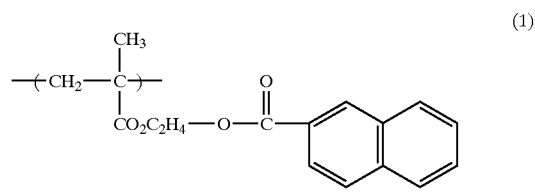
(1)

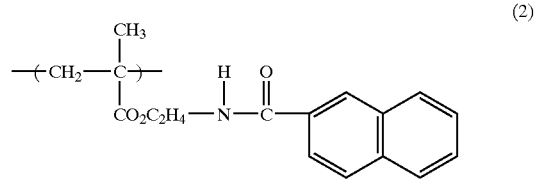
(2)

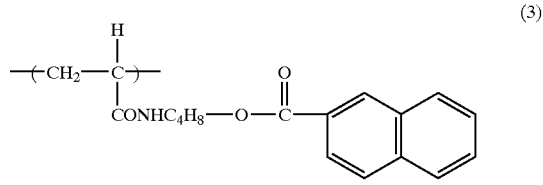
(3)

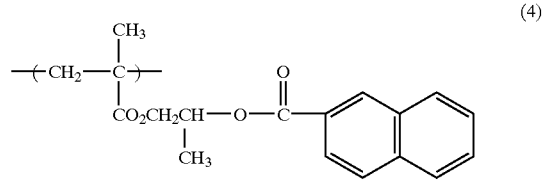
(4)

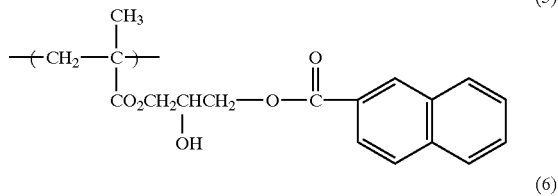
(5)

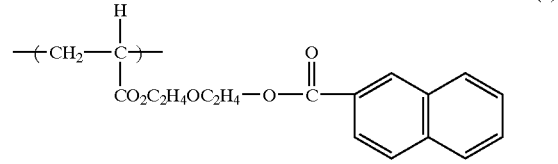
(6)

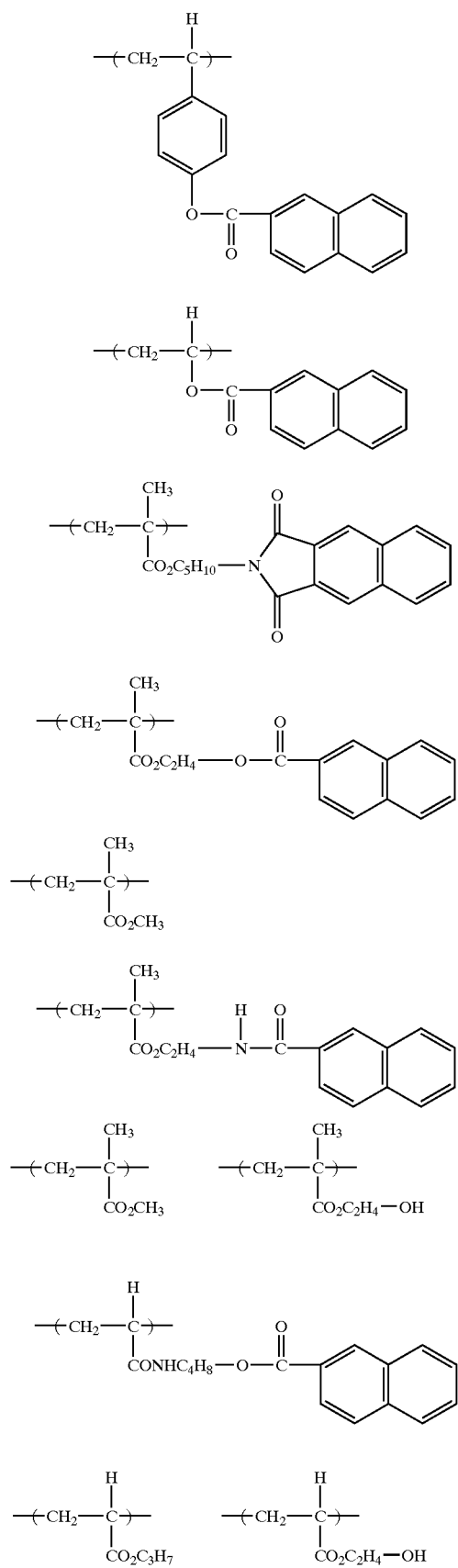
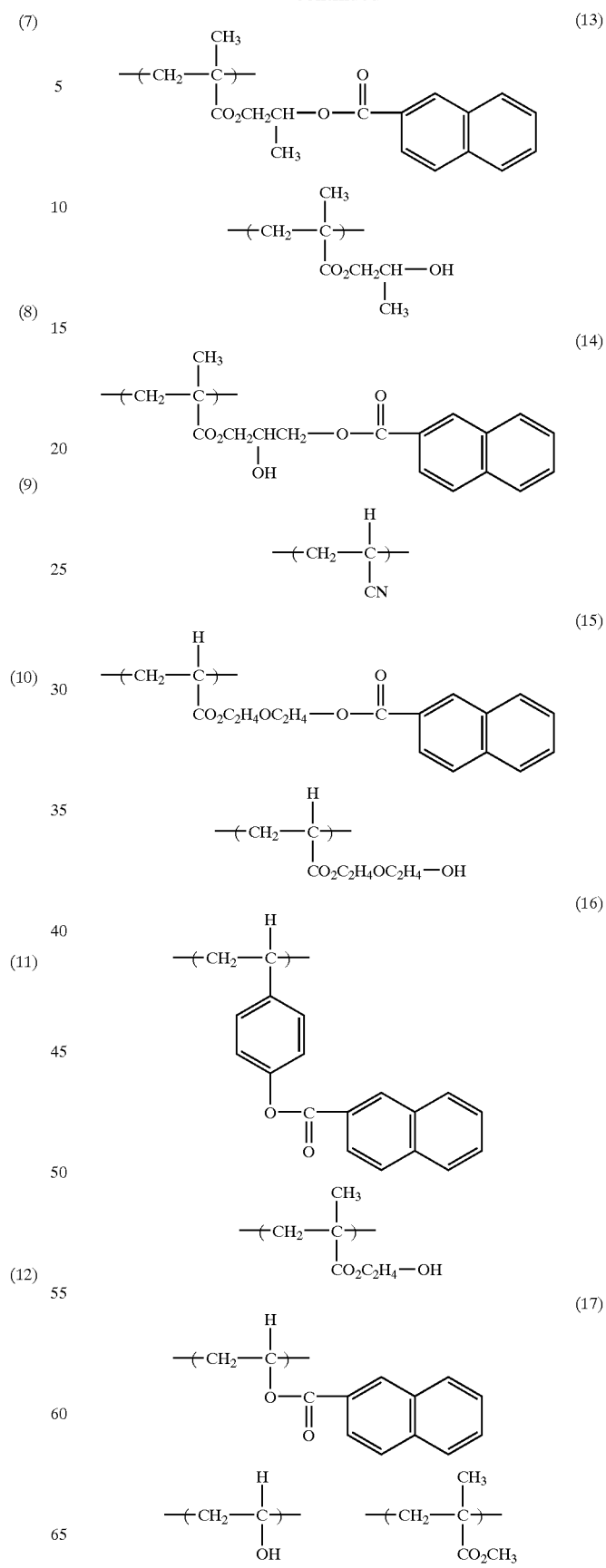

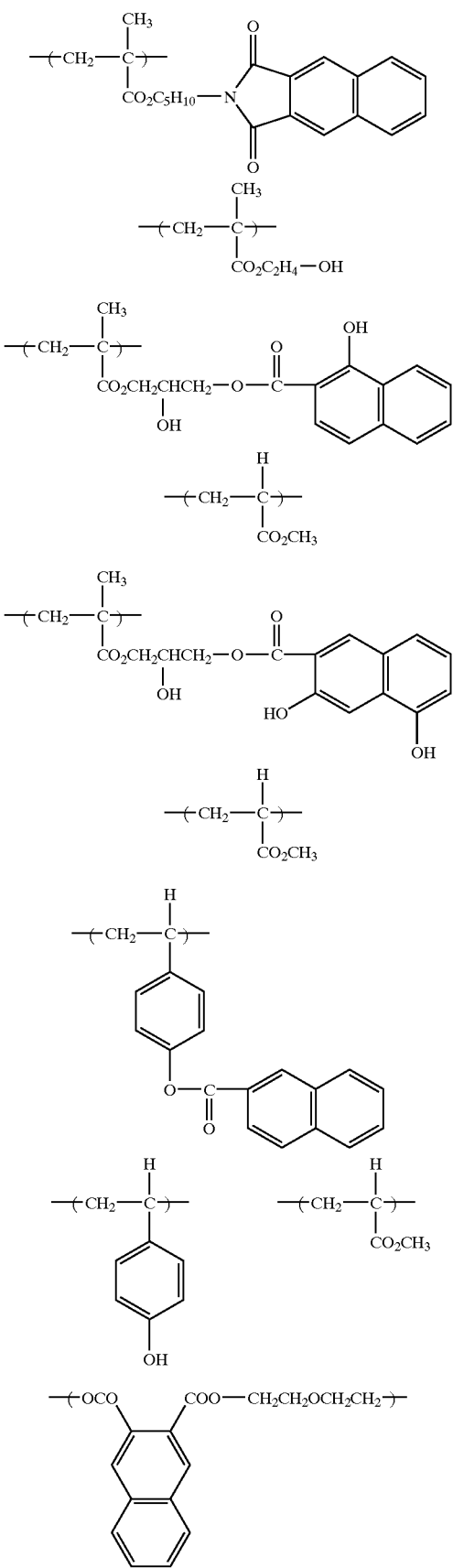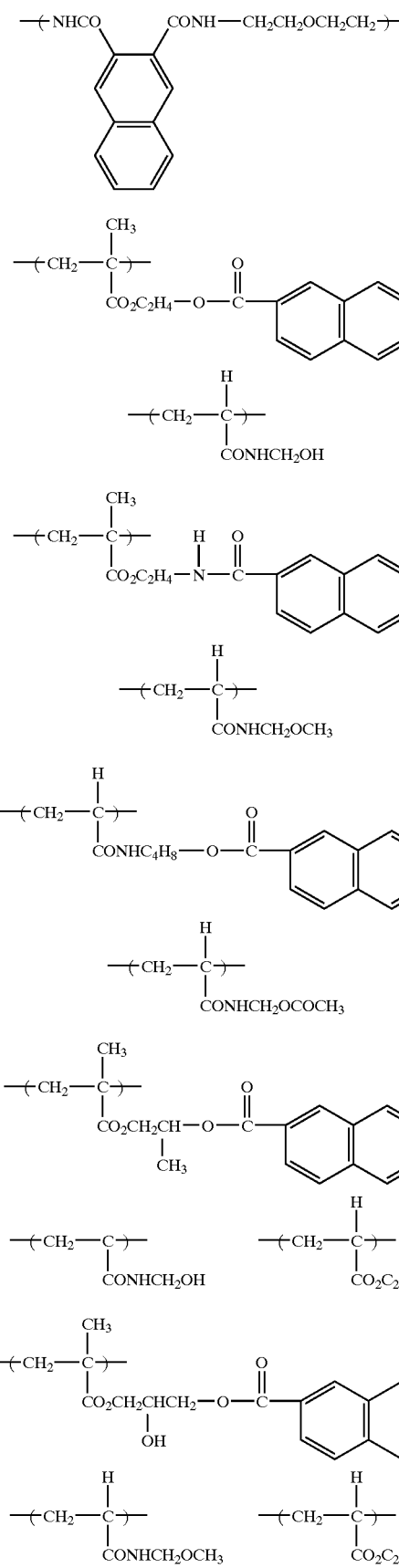

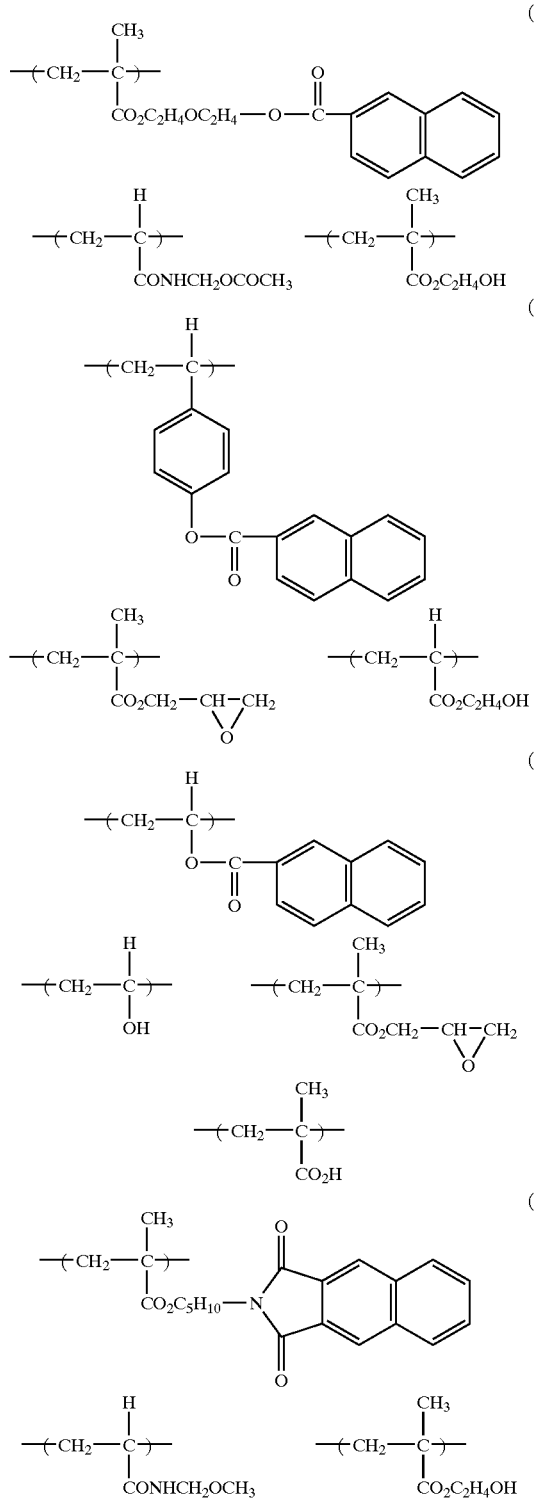

In formulae (IX) to (XXVI), the vinyl bond (—C═C—) (including —C═C— in the aromatic ring or heteroaromatic ring represented by $A_1$ or $A_2$) linking to the naphthalene group is preferably bonded to the β-position of the naphthalene ring so as to match with the wavelength (248 nm) of KrF excimer laser.

The divalent linking group represented by W' or Y' in formulae (IX) to (XXVI) may be specifically a single bond, and is preferably —$CO_2$—, —CONH—, —O—, —CO—, —$SO_2$—, a linear Rio alkylene, arylene or aralkylene group having from 1 to 20 carbon atoms, which may have a substituent, a branched alkylene group having from 1 to 20 carbon atoms, which may have a substituent, an alkylene group having from 1 to 20 carbon atoms, which may have a cyclic alkylene structure in the middle thereof, or a divalent group resulting from the combination of two or more of the above-described groups.

The divalent linking group represented by W' or Y' is more preferably —$CO_2$—E—, —CONH—E—, —O—E—, —CO—E—, —$SO_2$—E— (wherein E represents a single bond or an aromatic ring group having from 6 to 14 carbon atoms, which may have a substituent), an alkylene group having from 1 to 20 carbon atoms, which may have a substituent, an arylene group having from 6 to 20 carbon atoms, which may have a substituent, an aralkylene group having from 7 to 20 carbon atoms, which may have a substituent, or a divalent group resulting from the combination of the above-described group with one or more groups of —$CO_2$—, —CONH—, —O—, —CO—, an alkylene group having from 2 to 4 carbon atoms and —$SO_2$—.

Examples of the alkylene group having from 1 to 20 carbon atoms include a methylene group, an ethylene group, a propylene group, a butylene group, a pentylene group, a hexylene group, a heptylene group, an octylene group, a 2-ethylhexylene group, a nonylene group, a decylene group, a laurylene group, a stearylene group and a cyclohexylene group.

Examples of the arylene group having from 6 to 20 carbon atoms include a phenylene group, a naphthylene group, an anthrylene group and a phenanthrylene group.

Examples of the aralkylene group having from 7 to 21 carbon atoms include a benzyl group, a naphthylmethyl group, an anthrylmethyl group and a phenanthrylmethyl group.

Preferred examples of the substituent which the above-described groups each may further have, include an alkyl group having from 1 to 10 carbon atoms, —OH, —$OR^4$, $SR^4$, —$NR^5R^6$ and a halogen atom (wherein $R^4$ represents an alkyl group having from 1 to 20 carbon atoms and $R^5$ and R6 each represents a hydrogen atom or an alkyl group having from 1 to carbon atoms).

$X_1$ to $X_3$, which may be the same or different, each represents a hydrogen atom, a halogen atom, a cyano group or —$(X_4)_p$—R (wherein R represents an alkyl group having from 1 to 20 carbon atoms, which may have a substituent, an aryl group having from 6 to 20 carbon atoms, which may have a substituent, or an aralkyl group having from 7 to 20 carbon atoms, which may have a substituent, $X_4$ represents a single bond, —$CO_2$, —CONH—, —O—, —CO—, an alkylene group having from 2 to 4 carbon atoms or —$SO_2$—, and p represents an integer of from 1 to 10).

Examples of the alkyl group having from 1 to 20 carbon atoms include a methyl group, an ethyl group, an n-propyl group, an i-propyl group, an n-butyl group, an i-butyl group, a t-butyl group, an n-pentyl group, an n-hexyl group, a cyclohexyl group, an n-octyl group, a 2-ethylhexyl group, an n-nonyl group, an n-decyl group, an n-lauryl group or an n-stearyl group.

Examples of the aryl group having from 6 to 20 carbon atoms include a phenyl group, a naphthyl group, an anthryl group and a phenanthryl group.

Examples of the aralkyl group having from 7 to 21 carbon atoms include a benzyl group, a naphthylmethyl group, an anthrylmethyl group and a phenanthrylmethyl group.

$X_1$ to $X_3$ each is preferably a hydrogen atom, a cyano group, a methyl group, an ethyl group, an acetyl group or a benzoyl group.

$Z_1$ and $Z_2$ each is a substituent of the naphthalene group and an electron donating group. The electron donating group means an atom or atomic group having a Hammett's substituent constant $\sigma_p$ of a negative value. Specific examples thereof include —OH, —OR$^4$, —SR$^4$ or —NR$^5$R$^6$ (wherein R$^4$ represents an alkyl group having from 1 to 20 carbon atoms, and R$^5$ and R$^6$ each represents a hydrogen atom or an alkyl group having from 1 to 20 carbon atoms).

Preferred examples of the alkyl group having from 1 to 20 carbon atoms represented by R$^4$, R$^5$ or R$^6$, include a methyl group, an ethyl group, an n-propyl group, an i-propyl group, an n-butyl group, an i-butyl group, a t-butyl group, an n-pentyl group, an n-hexyl group, a cyclohexyl group, an n-octyl group, a 2-ethylhexyl group, an n-nonyl group, an n-decyl group, an n-lauryl group, an n-stearyl group, a 2-hydroxyethyl group, an allyl group, a 2,3-dichloropropyl group and a 2,3-dibromopropyl group. Among these, in view of no-reduction in the dry etching rate, a non-cyclic hydrocarbon group having from 1 to 6 carbon atoms such as methyl, ethyl, n-propyl, i-propyl, n-butyl, i-butyl, t-butyl, n-pentyl and n-hexyl, a 2-hydroxyethyl group, an allyl group, a 2,3-dichloropropyl group and a 2,3-dibromopropyl group are more preferred.

The substitution number m on the 6-membered ring side directly connected by the vinyl group (—C=C—) represents an integer of from 0 to 2, and the substitution number n on the other 6-membered ring side represents an integer of from 0 to 3. When n is 2 or 3, the $Z_1$ groups may be the same or different, and when m is 2 or 3, the $Z_2$ groups may be the same or different.

In the present invention, $A_1$ and $A_2$ each is a monovalent or divalent aromatic or heteroaromatic ring group having from 5 to 14 carbon atoms, which may have a substituent. Examples of the aromatic ring include a benzene ring, a naphthalene ring, an anthracene ring and a phenanthrene ring. Examples of the heteroaromatic ring include 5- to 14-membered heteroaromatic rings each having an oxygen, nitrogen or sulfur atom within the ring, such as a thiophene ring, a furan ring, a pyrrole ring, an imidazoyl ring, an isothiazoyl ring, a pyrazoyl ring, an isoxazoyl ring, an indole ring and an indazole ring. The aromatic or heteroaromatic ring may have a substituent and specific example of the substituent include an organic group having from 1 to 20 carbon atoms. Examples of the organic group include an alkyl group, an alkenyl group, an acyl group, an alkoxy group and an alkoxycarbonyl group. Other than the organic group, a fluorine atom, a chlorine atom, a bromine atom, an iodine atom, a nitro group, a cyano group, a hydroxy group and an amino group may be used as the substituent. Further, an alkylthio group, an amino group, an N-organoamino group, an N,N-diorganoamino group and a morpholino group may also be used as the substituent.

$A_1$ and $A_2$ each is preferably a divalent or monovalent group derived from a benzene ring, a naphthalene ring, an anthracene ring, a phenanthrene ring or a thiophene ring.

$X_1$, $X_2$, $Z_1$, $Z_2$, m, n, $A_1$ and $A_2$ in formulae (XVI) to (XXIII) each has the same meaning as defined above.

Also, $X_1$, $X_2$, $Z_1$, $Z_2$, m, n and $A_1$ in formulae (XXIV) to (XXVI) each has the same meaning as defined above.

In the present invention, the polymer light absorbent preferably has a repeating structural unit represented by formula (XXIV), (XXV) or (XXVI).

The polymer light absorbent contains the repeating to structural unit having a group represented by one of formulae (IX) to (XXVI) in an amount of from 10 to 99 wt %, preferably from 30 to 97 wt %, more preferably from 50 to 95 wt %, based on the total amount of the polymer light absorbent.

Such a light absorbent exhibits great effect of preventing the reflected light due to sufficiently high extinction coefficient in the light absorbing area and further, is restrained in the reduction of the dry etching rate even when the amount of light absorbing area added is increased to further increase the absorbance, because the ratio (percent by weight) of cyclic carbons contained in the light absorbing area, such as an aromatic ring, is small.

The bottom anti-reflective coating material composition of the present invention comprises a polymer light absorbent having a substituent represented by a specific structural formula on the side or main chain. The repeating unit of the polymer light absorbent may further be substituted by a group capable of thermal cross-linking reaction. When a group capable of thermal cross-linking reaction is substituted, intermixing can be further effectively prevented by heat-curing the coating. Examples of the repeating unit substituted by a group capable of ego thermal cross-linking reaction include the repeating units represented by formulae (XXVII) and (XXVIII).

In formulae (XXVII) and (XXVIII), R$^2$ represents a hydrogen atom, a methyl group, a chlorine atom, a bromine atom or a cyano group. In formula (XXVII), $B_1$ represents an organic functional group having —CH$_2$OH, —CH$_2$OR$^7$ or —CH$_2$OCOCH$_3$ at the terminal. In —CH$_2$OR$^7$, R$^7$ represents a hydrocarbon group having from 1 to 20 carbon atoms. $B_1$ is preferably a group resulting from the reaction of —CONHCH$_2$OH, —CONHCH$_2$OCH$_3$, —CH$_2$OCOCH$_3$, —C$_6$H$_4$CH$_2$OH, —C$_6$H$_4$CH$_2$OCH$_3$ or —CONHC(CH$_3$)$_2$CH$_2$COCH$_3$ with formalin.

In formula (XXVIII), $B_2$ represents an organic functional group having an epoxy terminal group. Examples of the epoxy group which is preferably introduced as a group capable of thermal cross-linking reaction include the groups represented by the following formulae:

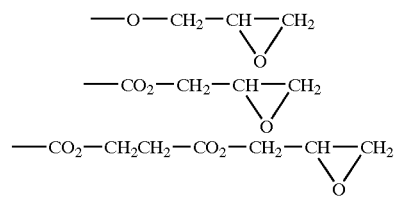

The polymer light absorbent contains the repeating structural unit represented by formula (XXVII) in an amount of from 2 to 50 wt %, preferably from 5 to 30 wt %, based on the total amount of the polymer light absorbent.

The polymer light absorbent contains the repeating structural unit represented by formula (XXVIII) in an amount of from 2 to 30 wt %, preferably from 5 to 20 wt %, based on the total amount of the polymer light absorbent.

The polymer light absorbent may be copolymerized together with the above-described thermal cross-linking repeating unit or may be copolymerized, without containing such a repeating unit, together with a non-cross-linking repeating unit. When a non-cross-linking repeating unit is copolymerized together, the dry etching rate and the reflectivity can be delicately controlled. Examples of the monomer constituting the non-cross-linking repeating unit include compounds having an addition polymerizable unsaturated bond such as an acrylic ester, a methacrylic ester, an acrylamide, a methacrylamide, an allyl compound, a vinyl ether, a vinyl ester, a styrene and a crotonic acid ester.

Specific examples thereof include:

acrylic esters such as alkyl acrylate (the alkyl group preferably has from 1 to 10 carbon atoms) (e.g., methyl acrylate, ethyl acrylate, propyl-acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate) and aryl acrylate (e.g., phenyl acrylate, hydroxyphenyl acrylate);

methacrylic esters such as alkyl methacrylate (the alkyl group preferably has from 1 to 10 carbon atoms) (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylol propane mono-methacrylate, pentaerythritol monomethacrylate, furfuryl methacrylate, tetrahydrofurfuryl methacrylate) and aryl methacrylate (e.g., phenyl methacrylate, hydroxyphenyl methacrylate, cresyl methacrylate, naphthyl methacrylate);

acrylamides such as acrylamide, N-alkylacrylamide (the alkyl group has from 1 to 10 carbon atoms and examples thereof include a methyl group, an ethyl group, a propyl group, a butyl group, a t-butyl group, a heptenyl group, an octyl group, a cyclohexyl group, a benzyl group, a hydroxyethyl group and a benzyl group), N-arylacrylamide (examples of the aryl group include a phenyl group, a tolyl group, a nitrophenyl group, a naphthyl group, a cyanophenyl group, a hydroxyphenyl group and a carboxyphenyl group), N,N-dialkylacrylamide (the alkyl group has from 1 to 10 carbon atoms and examples thereof include a methyl group, an ethyl group, a butyl group, an isobutyl group, an ethylhexyl group and a cyclohexyl group), N,N-arylacrylamide (examples of the aryl group include a phenyl group), N-methyl-Nphenylacrylamide, N-hydroxyethyl-N-methylacrylamide and N-2-acetoamidoethyl-N-acetylacrylamide;

methacrylamides such as methacrylamide, N-alkylmethacrylamide (the alkyl group has from 1 to 10 carbon atoms and examples thereof include a methyl group, an ethyl group, a t-butyl group, an ethylhexyl group, a hydroxyethyl group and a cyclohexyl group), N-arylmethacrylamide (examples of the aryl group include a phenyl group, a hydroxyphenyl group and a carboxyphenyl group), N,N-dialkylmethacrylamide (examples of the alkyl group include an ethyl group, a propyl group and a butyl group), N,N-diarylmethacrylamide (examples of the aryl group include a phenyl group), N-hydroxyethyl-N-methylmethacrylamide, N-methyl-N-phenylmethacrylamide and N-ethyl-N-phenylmethacrylamide;

allyl compounds such as allyl esters (e.g., allyl acetate, allyl caproate, allyl caprylate, allyl laurate, allyl palmitate, allyl stearate, allyl benzoate, allyl acetoacetate, allyl lactate) and allyloxyethanol;

vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), vinylaryl ether (e.g., vinylphenyl ether, vinyltolyl ether, vinylchlorophenyl ether, vinyl-2,4-dichlorophenyl ether, vinyl-naphthyl ether, vinylanthranyl ether);

vinyl esters such as vinyl butyrate, vinyl isobutyrate, vinyltrimethyl acetate, vinyldiethyl acetate, vinyl valerate, vinyl caproate, vinyl chloroacetate, vinyl dichloroacetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethyl-styrene, trifluoromethylstyrene, ethoxymethylstyrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethyl-styrene), hydroxystyrene (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl) styrene and carboxystyrene;

crotonic acid esters such as alkyl crotonate (e.g., butyl crotonate, hexyl crotonate, glycerol monocrotonate), dialkyl itaconates (e.g., dimethyl itaconate, diethyl itaconate, dibutyl itaconate);

dialkyl esters of maleic acid or fumaric acid (e.g., dimethyl maleate, dibutyl fumarate) or monoalkyl esters of maleic acid or fumaric acid;

an acrylic acid, a methacrylic acid, a crotonic acid, an itaconic acid, a maleic anhydride, a maleimide, an acrylonitrile, a methacrylonitrile and a maleylonitrile. In addition, an addition polymerizable unsaturated compound capable of copolymerization with the repeating structural unit used in the present invention may be used. These may be used either individually or in combination.

The polymer light absorbent preferably has a repeating unit derived from a monomer containing a hydroxyl group. When the repeating unit contains a hydroxyl group, the thermal cross-linking property is intensified. Preferred examples of the monomer which can form a repeating unit containing a hydroxyl group, include 2-hydroxyethyl (meth)acrylate, 2-hydroxypropyl (meth)acrylate, ethylene glycol mono(meth)acrylate, polyethylene glycol mono(meth)acrylate, propylene glycol mono(meth)acrylate, polypropylene glycol mono(meth)acrylate and their corresponding (meth)acrylamide monomer, vinyl alcohol, hydroxystyrene and hydroxymethylstyrene.

From the standpoint that good solvent solubility of the polymer can be kept without reducing the dry etching rate, an alkyl (meth)acrylate monomer having an alkyl chain having from 1 to 10 carbon atoms is also preferred.

N-vinylcarbazol can also be used as the non-cross-linking monomer.

The content of the non-cross-linking repeating unit is preferably from 20 to 50 mol %, more preferably from 30 to 40 mol %, based on all repeating units.

Specific examples of the polymer light absorbent for use in the present invention are set forth below, however, the present invention is by no means limited thereto.

(33)
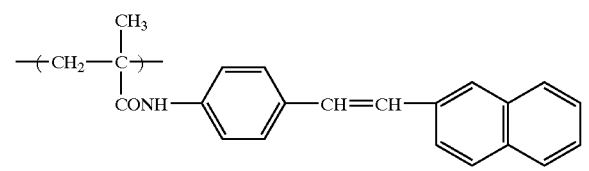

(34)
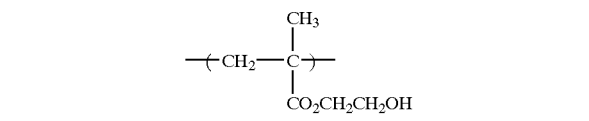

(35)
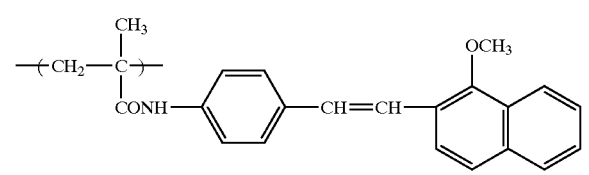

(36)
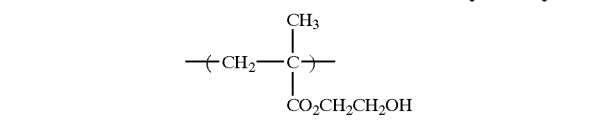

(37)
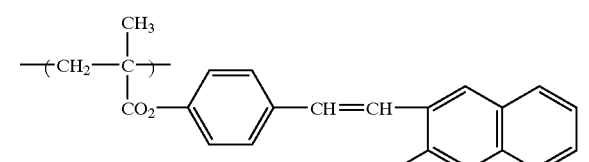

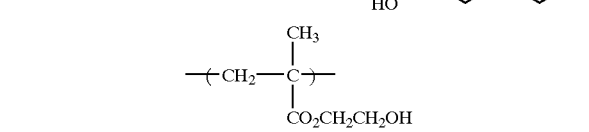

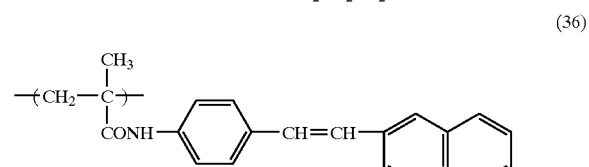

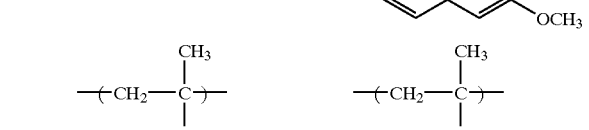

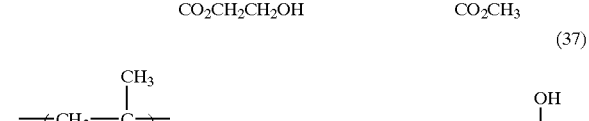

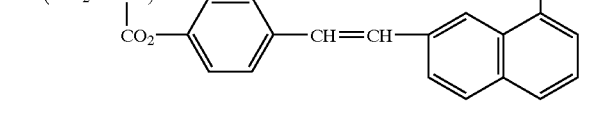

-continued

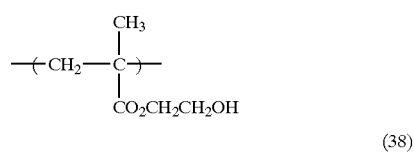

(38)
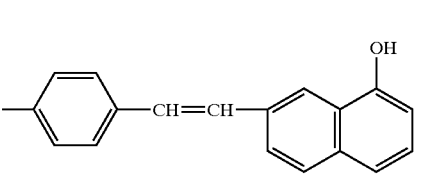

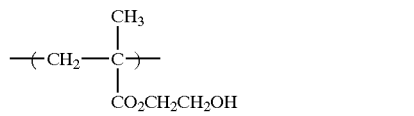

(39)
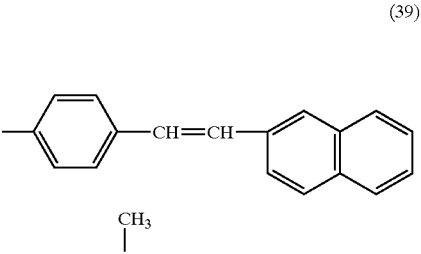

(40)

(41)

(42)
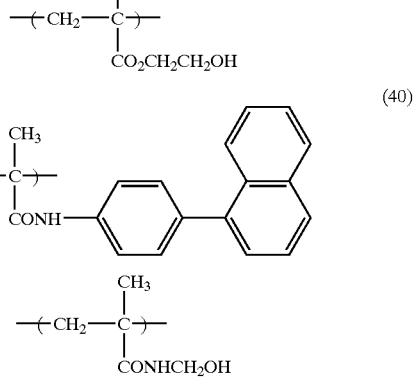

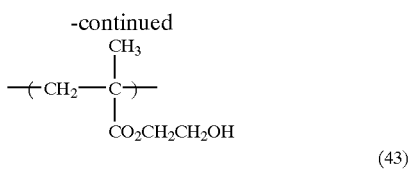

(43)

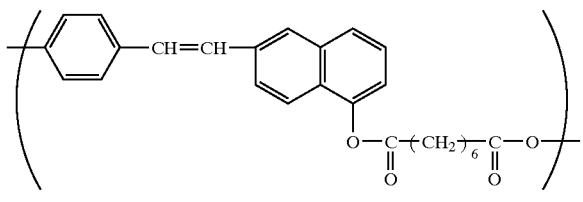

(44)

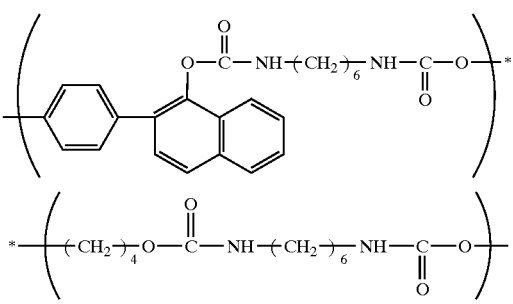

The polymer compound and the polymer light absorbent for use in the present invention can be synthesized by radical polymerization, anion polymerization or cation polymerization, and in terms of the polymer form, various methods such as solution polymerization, suspension polymerization, emulsion polymerization and block polymerization can be used. The repeating unit containing a structure represented by one of formulae (IX) to (XXVI) can be synthesized by introducing an amino group into respective light absorbents and reacting it with (meth)acrylic acid chloride in the presence of a basic catalyst.

Further, the polymer light absorbent having a structure represented by one of formulae (XVI) to (XXIII) on the main or side chain for use in the present invention can be obtained as a polymer such as polyester, polyurethane, polyamide or polyureido by using a diol or diamine having a structure represented by one of formulae (XVI) to (XXIII) as a starting monomer and reacting it with a dicarboxylic acid dichloride compound or a diisocyanate compound.

The molecular weight of such a homopolymer or copolymer of the polymer compound or the polymer light absorbent varies depending on the coating solvent used, the solution viscosity required and the coating shape required, however, the weight-average molecular weight thereof is usually from 1,000 to 1,000,000, preferably from 2,000 to 300,000, more preferably from 3,000 to 200,000.

The bottom anti-reflective coating material composition contains the polymer compound or the polymer light absorbent in an amount of preferably from 30 to 100 wt %, more preferably from 50 to 90 wt %, based on the total solids content.

The bottom anti-reflective coating material of the present invention is coated, for example, on a silicon substrate and a photoresist layer is coated thereon. In order to prevent intermixing with the overcoat photoresist, the coating layer after the coating on a silicon substrate or the like is preferably once cured and to this effect, a thermal cross-linking agent is preferably added. Examples or the thermal cross-linking agent used in combination with the polymer compound or the polymer light absorbent include the following compounds (b) and (c):

(b) a melamine, guanamine, glycoluril or urea compound substituted by at least one substituent selected from a methylol group, an alkoxymethyl group and an acyloxymethyl group; and (c) a phenol, naphthol or hydroxyanthtacene compound substituted by at least one substituent selected from a methylol group, an alkoxymethyl group and an acyloxymethyl group.

The number of the methylol, alkoxymethyl or acyloxymethyl group as the substituent contained in component (b) is, in the case of a melamine compound, from 2 to 6, preferably from 5 or 6, and in the case of a glycoluril, guanamine or urea compound, from 2 to 4, preferably 3 or 4.

These methylol group-containing compounds can be obtained by reacting melamine, glycoluril, guanamine or urea with formalin in the presence of a basic catalyst such as sodium hydroxide, potassium hydroxide, ammonia or tetraalkyl-ammonomium hydroxide.

The alkoxymethyl group-containing compound can be obtained by heating the methylol group-containing compound in an alcohol in the presence of an acid catalyst such as hydrochloric acid, sulfuric acid, nitric acid, or methanesulfonic acid. The acyloxymethyl group-containing compound can be obtained by mixing and stirring the methylol group-containing compound with acyl chloride in the presence of a basic catalyst.

Specific examples of the compound having the above-described substituent are described below. Examples of the melamine compound include compounds resulting from methoxy methylating from 1 to 5 methylol groups of hexamethylolmelamine, hexamethoxymethylmelamine or hexamethylolmelamine, a mixture thereof, compounds resulting from acyloxymethylating from 1 to 5 methylol groups of hexamethoxyethylmelamine, hexaacyloxymethylmelamine or hexamethylolmelamine, and a mixture thereof.

Examples of the guanamine compound include compounds resulting from methoxymethylating from 1 to 3 methylol groups of tetramethylolguanamine, tetramethoxymethylguanamine or tetramethylolguanamine, a mixture thereof, compounds resulting from acyloxymethylating from 1 to 3 methylol groups of tetramethoxyethylguanamine, tetraacyloxymethylguanamine or tetramethylolguanamine, and a mixture thereof.

Examples of the glycoluril compound include compounds resulting from methoxymethylating from 1 to 3 methylol groups of tetramethylol glycoluril, tetramethoxymethyl glycoluril or tetramethylol glycoluril, a mixture thereof, compounds resulting from acyloxymethylating from 1 to 3 methylol groups of tetramethylol glycoluril, and a mixture thereof.

Examples of the urea compound include compounds resulting from methoxymethylating from 1 to 3 methylol groups of tetramethylolurea, tetramethoxymethylurea or tetramethylolurea, a mixture thereof, and tetramethoxyethylurea.

These compounds maybe used either individually or in combination.

The bottom anti-reflective coating material composition of the present invention contains component (b) in an amount of from 2 to 50 wt %, preferably from 5 to 30 wt %, based on the solids content.

The phenol, naphthol or hydroxyanthracene compound substituted by at least one group selected from a methylol group, an alkoxymethyl group and an acyloxymethyl group, which is contained as component (c), prevents intermixing with the overcoat photoresist by the thermal cross-linking and further increases the absorbance of the bottom anti-reflective coating material composition, similarly to component (b).

With respect to the number of methylol, acyloxymethyl or alkoxymethyl groups contained in component (c), at least two groups are necessary per one molecule and in view of the thermal cross-linking property and storage stability, compounds in which the phenolic OH group has a substituent all at the 2-position and the 4-position thereof, are preferred.

In the naphthol or hydroxyanthracene compound as a skeleton, the OH group is preferably unsubstituted at the 2-position.

The phenol compound as a skeleton may or may not have a substituent at the 3- or 5-position. Also in the naphthol compound as a skeleton, the OH group may or may not have a substituent at the sites exclusive of the 2-position.

The methylol group-containing compound can be obtained by reacting a phenolic OH group-containing compound used as a starting material, in which the phenolic OH group has a hydrogen atom at the 2- or 4-position, with formalin in the presence of a basic catalyst such as sodium hydroxide, potassium hydroxide, ammonia or tetraalkylammonium hydroxide.

The alkoxymethyl group-containing compound can be obtained by heating the above-described methylol group-containing compound in an alcohol in the presence of an acid catalyst such as hydrochloric acid, sulfuric acid, nitric acid or methanesulfonic acid.

The acyloxymethyl group-containing compound can be obtained by reacting the above-described methylol group-containing compound with acyl chloride in the presence of a basic catalyst.

The skeleton compound which can be used is a phenol, naphthol or hydroxyanthracene compound in which the phenolic OH group is unsubstituted at the 2- or 4-position and examples thereof include phenol, o-cresol, m-cresol, p-cresol, 2,3-xylenol, 2,5-xylenol, 3,4-xylenol, 3,5-xylenol, bisphenols such as bisphenol A, 4,4'-bishydroxybiphenyl, Tris P-PA (produced by Honshu Chemical Industry Co., Ltd.), naphthol, dihydroxynaphthalene and 2,7-dihydroxyanthracene.

Specific examples of component (c) include compounds resulting from methoxymethylating 1 or 2 methylol groups of trimethylolphenol, tri(methoxymethyl)phenol or trimethylolphenol, compounds resulting from methoxymethylating 1 or 2 methylol groups of trimethylol-3-cresol, tri(methoxymethyl)-3-cresol or trimethylol-3-cresol, dimethylolcresols such as 2,6-dimethylol-4-cresol, compounds resulting from methoxymethylating from 1 to 3 methylol groups of tetramethylolbisphenol A, tetramethoxymethylbisphenol A or tetramethylolbisphenol A, compounds resulting from methoxymethylating from 1 to 5 methylol groups of tetramethylol-4,4'-bishydroxybiphenyl, tetramethoxymethyl-4,4'-bishydroxybiphenyl, hexamethylol form of Tris P-PA, hexamethoxymethyl form of Tris P-PA or hexamethyl form of Tris P-PA, and silo bishydroxymethylnaphthalenediols.

Examples of the hydroxyanthracene compound include 1,6-dihydroxymethyl-2,7-dihydroxyanthracene.

Examples of the acyloxymethyl group-containing compound include compounds resulting from acyloxymethylating a part or all of the methylol groups of the above-described methylol group-containing compound.

Among these compounds, preferred are trimethylolphenol, bishydroxymethyl-p-cresol, tetramethylolbishenol A, hexamethylol of Tris P-PA (produced by Honshu Chemical Industry Co., Ltd.), and phenol compounds derived therefrom in which the methylol group is substituted by an alkoxymethyl group or by both a methylol group and an alkoxymethyl group. These may be used either individually or in combination.

Component (c) is contained in the composition of the present invention in an amount of from 2 to 50 wt %, preferably from 5 to 30 wt %, based on the solids content.

The bottom anti-reflective coating composition of the present invention may contain a separate light absorbent, an adhesion aid, a surface active agent or a heat acid generator, if desired.

Examples of the separate light absorbent include commercially available light adsorbents described in *Kogyo-yo Shikiso no Gijutsu to Shijo* (*Technology and Market of Industrial Dyes*), CMC Shuppan, and *Senryo Binran* (*Dyestuffs Handbook*), compiled by Yuki Gosei Kagaku Kyokai, and for example, C.I. Disperse Yellow 1, 3, 4, 5, 7, 8, 13, 23, 31, 49, 50, 51, 54, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Orange 2 and 45, C.I. Solvent Red 1, 3, 8, 23, 24, 25, 27 and 49, C.I. Pigment Green 10, and C.I. Pigment Brown 2 may be suitably used. The light absorbent is usually blended in a proportion of 50 parts by weight or less, preferably 30 parts by weight or less, per 100 parts by weight of the bottom anti-reflective coating composition.

The adhesion aid is added mainly for the purpose of improving the adhesion between the substrate or resist and the bottom anti-reflective coating composition, particularly for preventing the peeling of the resist in the etching process. Specific examples thereof include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chlropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazolthiouracil, mercaptoimidazole and mercaptopyrimidine, and ureas and thiourea compounds such as 1,1-dimethylurea and 1,3-dimethylurea.

The adhesion aid is usually blended in a proportion of less than 10 parts by weight, preferably less than 5 parts by weight, per 100 parts by weight of the bottom anti-reflective coating composition.

The bottom anti-reflective coating composition of the present invention may contain a surface active agent so as to further improve the coating property such as striation.

Examples of the surface active agent include a nonionic surface active agent such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristeacrate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), a fluorine-base surface active agent such as Eftop EF301, EF303, EF352 (all produced by Shin Akita Kasei KK), Megafac F171, F173 (both produced by Dainippon Ink and Chemicals, Inc.), Florad FC430, FC431 (both produced by Sumitomo 3M KK), Asahiguard AG710 and Surflon S-382, SC101, SC102, SC103, SC104, SC105, SC106 (all produced by Asahi Glass Co., Ltd.), Organosiloxane Polymer KP341 (produced by Shin-Etsu Chemical Co., Ltd.), and an acrylic acid-base or methacrylic acid-base (co)polymer such as Polyflow No. 75, No. 95 (produced by Kyoeisha Chemical Co., Ltd.). Among these surface active agents, a fluorine-base surface active agent and a silicon-base surface active agent are preferred. The surface active agent is usually blended in an amount of 2 parts by weight or less, preferably 1 part by weight or less, per 100 parts by weight of the solids content in the composition of the present invention.

The above-described surface active agents may be added individually or in combination.

Examples of the heat acid generator include iodonium salts, sulfonium salts, diazonium salts, imidosulfonates, 2-nitrobenzyltosylate, and organic sulfanic acid alkylesters. Particularly, from the standpoints of acid generation efficiency and storage stability, diaryl iodonium salts are preferred. As the aryl group, an unsubstituted or alkyl-substituted phenyl group and particularly an unsubstituted phenyl group or a phenyl group having a $C_{1-18}$ alkyl substituent at the p-position are preferred from the standpoint of solubility. As the counter anion, anions such as halogen, organic sulfonate, $BF_4$ and $PF_6$ are suitably used.

The bottom anti-reflective coating composition comprising a polymer light absorbent, a light absorbent, an adhesion aid, a surface active agent and the like is usually dissolved in an appropriate solvent. Examples of the solvent which can be used for dissolving these include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methylether acetate, propylene glycol propylether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, methyl lactate and ethyl lactate. These organic solvents may be used individually or in combination of two or more.

Further, a high boiling point solvent such as N-methylformamide, N,N-dimethylformamide, N-methylacetamide, N,N-dimethylacetamide, N-methylpyrrolidone, dimethyl sulfoxide and benzyl ethyl ether, may be used in combination.

Among these solvents, propylene glycol methyl ether acetate, ethyl 3-ethoxypropionate and methyl lactate are preferred in view of safety.

The bottom anti-reflective coating composition of the present invention is usually used as follows. The bottom anti-reflective coating composition is dissolved in a solvent having concentration of about 10 wt % and coated on a substrate as used in the production of a precision integrated circuit element (for example, a transparent substrate such as silicon/silicon dioxide coating, glass substrate and ITO substrate) by an appropriate coating method such as spinner or coater to form a bottom anti-reflective coating. In the case when the composition contains a thermal cross-linking agent or when the polymer light absorbent has a thermal cross-linking substituent, after the coating, the coating is cured by heating it at a predetermined temperature. The bottom anti-reflective coating preferably has a thickness of from 0.01 to 3.0 μm. The heating after the coating is performed at a temperature of from 80 to 250° C. for from 1 to 120 minutes. On the thus-obtained anti-reflective coating, a photoresist is coated and then exposed through a predetermined mask. Examples of the light source for exposure include i line of mercury as the light having a wavelength of 365 nm, KrF excimer laser light as the light having a wavelength of 248 nm, and ArF excimer laser light as the light having a wavelength of 193 nm.

After heating (post exposure bake, hereinafter referred to as "PEB") if desired, the laminate is developed, rinsed and dried to obtain a photoresist.

In the present invention, the resist coated on the bottom anti-reflective coating may be either negative or positive, however, a chemical amplification type resist comprising a binder having a group capable of decomposing by a photo acid generator and an acid to increase the alkali dissolution rate, a chemical amplification type resist comprising an alkali soluble binder and a low molecular compound capable of decomposing by a photo acid generator and an acid to increase the alkali dissolution rate of the resist, or a chemical amplification type resist comprising a binder capable of decomposing by a photo acid generator and an acid to increase the alkali dissolution rate and a low molecular compound capable of decomposing by an acid to increase the alkali dissolution resist may be suitably used. Examples thereof include ARCH-2 produced by Fuji Hunt Microelectronics KK.

Examples of the developer suitable for a positive photoresist composition using the bottom anti-reflective coating composition of the present invention, include an aqueous solution of inorganic alkalis such as sodium hydroxide, potassium hydroxide, sodium carbonate, sodium silicate, sodium metasilicate and aqueous ammonia, an aqueous solution of primary amines such as ethylamine and n-propylamine, an aqueous solution of secondary amines such as diethylamine and di-n-butylamine, an aqueous solution of tertiary amines such as triethylamine and methyldiethylamine, an aqueous solution of alcohol amines such as dimethylethanolamine and triethanolamine, an aqueous solution of quaternary ammonium salts such as tetramethylammonium hydroxide and tetraethylammonium hydroxide, and an aqueous solution of cyclic amines such as pyrrole and piperazine. Further, an alcohol such as isopropyl alcohol or a surface active agent such as a nonionic surface active agent may be added to and used in the aqueous solution of alkalis in an appropriate amount.

Among the above-described developers, quaternary ammonium salt is preferred, and tetramethylammonium hydroxide and choline are more preferred.

The composition for a bottom anti-reflective coating material of the present invention exhibits great effect of preventing the reflected light due to sufficiently high extinction coefficient in the light absorbing area and further, is restrained in the reduction of the dry etching rate even when the amount of light absorbing area added is increased to further increase the absorbance, because the ratio (percent by weight) of cyclic carbons contained in the light absorbing area, such as an aromatic ring, is small.

The present invention is described in greater detail below by referring to the Examples, however, the present invention should not be construed as being limited thereto.

SYNTHETIC EXAMPLE 1

Synthesis of Compound (10)
Synthesis of Monomer:
130 g of 2-hydroxyethyl methacrylate and 190.5 g of 2-chloronaphthoyl were added to 600 ml of acetone and thereto, 101 g of triethylamine was added dropwise. The mixture was reacted at 40° C. for 4 hours, 2 l of distilled water was added thereto, and the product precipitated was collected by decantation. The product was purified by a silica gel column chromatography. Yield: 75%.
Synthesis of Polymer:
10 g of the monomer prepared above and 10 g of methyl methacrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 34,000.

SYNTHESIS EXAMPLE 2

Synthesis of Compound (13)
Synthesis of Monomer:
144 g of 2-hydroxypropyl methacrylate and 190.5 g of 2-chloronaphthoyl were added to 600 ml of acetone and thereto, 101 g of triethylamine was added dropwise. The mixture was reacted at 40° C. for 4 hours, 2 l of distilled water was added thereto, and the product precipitated was collected by decantation.

The product was purified by a silica gel column chromatography. Yield: 80%.
Synthesis of Polymer:
12 g of the monomer prepared above and 10 g of 2-hydroxypropyl methacrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 25,000.

SYNTHESIS EXAMPLE 3

Synthesis of Compound (14)
Synthesis of Monomer:
142 g of glycidyl methacrylate, 172 g of 2-naphthoic acid and 0.5 g of methoxyhydroquinone were added to 600 ml of acetone and thereto, 101 g of triethylamine was added dropwise. The mixture was reacted at 70° C. for 4 hours, 2 l of distilled water was added thereto, and the product precipitated was collected by decantation. The product was purified by a silica gel column chromatography. Yield: 80%.
Synthesis of Polymer:
12 g of the monomer prepared above and 8 g of acrylonitrile were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 19,000.

SYNTHESIS EXAMPLE 4

Synthesis of Compound (15)
Synthesis of Monomer:
160 g of diethylene glycol acrylate and 190.5 g of 2-chloronaphthoyl were added to 600 ml of acetone and thereto, 101 g of triethylamine was added dropwise. The mixture was reacted at 40° C. for 4 hours, 2 l of distilled water was added thereto, and the product precipitated was collected by decantation. The product was purified by a silica gel column two chromatography. Yield: 80%.
Synthesis of Polymer:
12 g of the monomer prepared above and 10 g of diethylene glycol acrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 52,000.

SYNTHESIS EXAMPLE 5

Synthesis of Compound (18)
Synthesis of Monomer:
103 g of 5-aminopentanol and 400 g of dioxane were added to 198 g of 2,3-naphthalenedicarboxylic acid anhydride and the mixture was reacted at 80° C. for 4 hours. 200 g of the imide form obtained was dissolved in 500 g of DMF, 74 g of methacryloyl chloride was added thereto, and then 72 g of triethylamine was added dropwise. The mixture was reacted at 40° C. for 4 hours, 2 l of distilled water was added thereto, and the product precipitated was collected by filtration. The product was recrystallized with ethyl acetate/hexane.
Yield: 72%.
Synthesis of Polymer:
12 g of the monomer prepared above and 10 g of 2-hydroxyethyl methacrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 41,000.

SYNTHESIS EXAMPLE 6

Synthesis of Compound (27)
18 g of the methacrylate monomer obtained in the monomer synthesis in Synthesis Example 2, 2.5 g of N-methylolacrylamide and 16 g of 2-hydroxyethyl acrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 18,000.

SYNTHESIS EXAMPLE 7

Synthesis of Compound (22)

24.4 g of dimethyl 2,3-naphthalenedicarboxylate was added to 21.2 g of diethylene glycol and thereto, 0.02 g of calcium acetate and antimony trioxide were added as catalysts. The mixture was heated up to 200° C. while blowing nitrogen gas thereinto. The temperature was further raised under reduced pressure to distill off excessive diethylene glycol, thereby obtaining the objective polymer.

SYNTHESIS OF COMPARATIVE EXAMPLE 1

208 g of 9-hydroxymethylanthracene, 101 g of triethylamine and 1 g of hydroquinone were dissolved in 1 l of DMF and thereto, 90 g of acryloyl chloride was added dropwise over 2 hours under the control such that the liquid temperature of the reaction solution did not exceed 30° C. Then, 2 l of distilled water was added and the crude crystal precipitated was collected by filtration. The crude crystal obtained was recrystallized with ethanol/water. Yield: 75%.

7 g of the acryl monomer obtained and 12 g of methyl acrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 4,000.

EXAMPLES 1 TO 6 AND COMPARATIVE EXAMPLE 1

18 g of each polymer light absorbent obtained in Synthesis Examples 1 to 6, 2 g of hexamethoxymethylmelamine and 0.30 g of diphenyl iodonium tosylate were dissolved in ethoxyethyl propionate to obtain a 10% solution and the resulting solution was filtered through a Teflon-made microfilter having a pore size of 0.10 μm to prepare a bottom anti-reflective coating solution. This coating solution was coated on a silicon wafer by means of a spinner and heated on a vacuum contact system hot plate at 170° C. for 3 minutes to form a bottom anti-reflective coating. In the same manner, a bottom anti-reflective coating solution was prepared from the polymer obtained in Synthesis of Comparative Example 1.

EXAMPLES 7 TO 12

Bottom anti-reflective coating solutions of Examples 7 to 12 were prepared in the same manner as in Examples 1 to 6 except for using 2.0 g of hexamethylol form of Tris P-PA (produced by Honshu Chemical Industry Co., Ltd.) in place of hexamethoxymethylmelamine in Examples 1 to 6.

EXAMPLE 13

A bottom anti-reflective coating solution of Example 13 was prepared in the same manner as in Examples 1 to 6 except that 3 g of hexamethoxymethylmelamine was added to 5 g of the polymer obtained in Synthesis Example 7 and the mixture was dissolved in ethyl lactate to obtain a 10% solution.

Each bottom anti-reflective coating solution of Examples 1 to 13 and Comparative Example 1 was filtered through a Teflon-made microfilter having a pore size of 0.10 μm, coated on a silicon wafer by means of a spinner and then heated on a vacuum contact system hot plate at 170° C. for 3 minutes to form a bottom anti-reflective coating.

The bottom anti-reflective coatings prepared all were regulated to have a thickness of 0.17 μm. Each bottom anti-reflective coating was dipped in a coating solvent used for the resist, such as γ-butyrolactone or ethoxyethyl propionate, and verified to be insoluble in the solvent.

On each bottom anti-reflective coating obtained, ARCH-2 (produced by Fuji Hunt Electronics Technology KK) as a positive photoresist for KrF excimer laser was coated (thickness: 0.85 μm), exposed using a reduction projection exposure apparatus (NSR-2005i9C, manufactured by Nikon KK), subjected to post exposure baking at 110° C. for 60 seconds, developed with a 2.38% aqueous tetramethylammonium hydroxide solution for 1 minute and then dried for 30 seconds. The thus-obtained resist pattern on the silicon wafer was observed through a scanning type electron microscope and examined on the limiting resolution and the film thickness dependency. Further, the coating absorbance at 248 nm and the dry etching rate were also evaluated.

In the measurement of the coating absorbance at 248 nm, each composition for a bottom anti-reflective coating material was coated on a quartz plate, then dried by heating to form a coating, and the coating was measured by a spectrophotometer UV-240 manufactured by Shimadzu Corporation.

The limiting resolution means a limiting resolution at the exposure amount necessary for reproducing a mask pattern of 0.50 μm when the film thickness is 0.85 μm. The film thickness dependency was evaluated by the ratio of the sensitivity with the resist film thickness of 0.85 μm to the sensitivity with the film thickness of 0.87 μm. A value closer to 1.0, namely, the lower dependency, is preferred.

The dry etching rate was measured under the condition of $CF_4/O_2$ by means of CSE-1110 manufactured by ULVAC Japan, Ltd.

The evaluation results are shown in Table 1 below. It is seen from the results that the composition for a bottom anti-reflective coating material of the present invention has a high coating absorbance, is improved in the limiting resolution of the photoresist, and is reduced in the film dependency of the sensitivity ascribable to the standing wave resulting from the decrease of reflected light from the substrate.

TABLE 1

| Compound | Coating Absorbance at 248 nm (/μm) | Limiting Resolution (μm) | Film Thickness Dependency | Dry Etching Rate (Å/min) |
|---|---|---|---|---|
| Example 1 | 8.011 | 0.27 | 0.98 | 683 |
| Example 2 | 8.373 | 0.27 | 0.98 | 662 |

TABLE 1-continued

| Compound | Coating Absorbance at 248 nm (/μm) | Limiting Resolution (μm) | Film Thickness Dependency | Dry Etching Rate (Å/min) |
|---|---|---|---|---|
| Example 3 | 7.893 | 0.27 | 0.98 | 691 |
| Example 4 | 7.968 | 0.27 | 0.98 | 683 |
| Example 5 | 8.011 | 0.27 | 0.98 | 679 |
| Example 6 | 8.718 | 0.27 | 0.98 | 690 |
| Example 7 | 7.339 | 0.27 | 0.98 | 622 |
| Example 8 | 7.493 | 0.27 | 0.98 | 601 |
| Example 9 | 7.037 | 0.27 | 0.98 | 623 |
| Example 10 | 7.011 | 0.27 | 0.98 | 618 |
| Example 11 | 7.176 | 0.27 | 0.98 | 598 |
| Example 12 | 8.718 | 0.27 | 0.98 | 590 |
| Example 13 | 9.314 | 0.27 | 0.98 | 659 |
| Comparative Example 1 | 8.157 | 0.28 | 0.97 | 512 |

SYNTHETIC EXAMPLE 8

Compound (40) as the Polymer Light Absorbent was Synthesized

Synthesis of Monomer:

204 g of 1-phenylnaphthalene was nitrated in 1 l of acetic acid using nitric acid. The product was reduced using a reduced iron to obtain 1-(4-aminophenyl)naphthalene (yield: 39%).

110 g of the amine obtained above and 55 g of acryloyl chloride were added to 600 ml of acetone and thereto, 51 g of triethylamine was added dropwise. The mixture was reacted at 40° C. for 4 hours, 2 l of distilled water was added thereto, and the product precipitated was collected by filtration (yield: 75%).

Synthesis of Polymer:

10 g of the monomer prepared above and 8 g of N-methylolacrylamide were dissolved in 40 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 24,000.

SYNTHESIS EXAMPLE 9

Compound (41) as the Polymer Light Absorbent was Synthesized

Synthesis Monomer:

202 g of 1-bromo-4-nitrobenzene and 207 g of 2-bromonaphthalene were subjected to Ullmann coupling using a copper catalyst. The product was purified by a column chromatography to obtain 2-(4-nitrophenyl)naphthalene. The product was reduced using a reduced iron to obtain 2-(4-aminophenyl)naphthalene (yield: 36%).

109 g of the amine obtained above and 55 g of acryloyl chloride were added to 600 ml of acetone and thereto, 51 g of triethylamine was added dropwise. The mixture was reacted at 40° C. for 4 hours, 2 l of distilled water was added thereto, and the product precipitated was collected by filtration (yield: 68%).

Synthesis of Polymer:

10 g of the monomer prepared above, 8 g of 2-hydroxyethyl methacrylate and 4 g of methyl methacrylate were dissolved in 40 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 48,000.

SYNTHESIS EXAMPLE 10

Compound (36) as the Polymer Light Absorbent was Synthesized

Synthesis of Monomer:

50 g of (4-nitrobenzyl)triphenylphosphonium bromide and 18.6 g of 6-methoxy-2-naphthoaldehyde were dissolved in ethanol and thereto, 54 g of sodium ethoxide was added and reacted. Water was added to the reaction solution to precipitate crystals (yield: 67%)

The crystal obtained was reduced in acetic acid using a reduced iron to reduce the nitro group into an amino group.

The aniline form obtained was converted into a methacrylamide-type monomer in DMF with methacrylic acid chloride and triethylamine.

Synthesis of Polymer:

10 g of the monomer prepared above, 6 g of 2-hydroxyethyl methacrylate and 4 g of methyl methacrylate were dissolved in 40 g of DMF, then the reaction solution was heated at 65° C. and at the same time, nitrogen was blown into the reaction solution for 30 minutes. 50 mg of V-65 (produced by Wako Pure Chemical Industries, Ltd.) as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 21,000.

SYNTHESIS EXAMPLE 11

Compound (44) as the Polymer Light Absorbent was Synthesized 9.44 g of 1-hydroxy-2-(4-hydroxyphenyl)naphthalene, 5.40 g of 1,4-butanediol and 16.8 g of hexamethylene diisocyanate were dissolved in 100 g of dimethylacetamide. After adding 0.02 g of n-butyltin dilaurate as a catalyst was added, the solution was reacted by heating at 160° C. The product was reprecipitated in water and recovered. The molecular weight was measured by GPC (THF solvent-base) and found to be 4,900.

SYNTHESIS OF COMPARATIVE EXAMPLE 2

208 g of 9-hydroxymethylanthracene, 101 g of triethylamine and 1 g of hydroquinone were dissolved in 1 l of DMF and thereto, 90 g of acryloyl chloride was added dropwise over 2 hours under the control such that the liquid temperature of the reaction solution did not exceed 30° C. Then, 2 l of distilled water was added and the crude crystal precipitated was collected by filtration. The crude crystal obtained was recrystallized with ethanol/water (yield: 75%).

7 g of the acryl monomer obtained and 12 g of methyl acrylate were dissolved in 60 g of DMF, then the reaction solution was heated at 65° C. and at the same time, nitrogen was blown into the reaction solution for 30 minutes. 50 mg of V-65 (produced by Wako Pure Chemical Industries, Ltd.)

as a polymerization initiator was added three times every 2 hours. The reaction product was reprecipitated in 1 l of distilled water and recovered as powder. The polymer obtained was subjected to GPC analysis and found to have a weight-average molecular weight, in terms of standard polystyrene, of 4,000.

EXAMPLES 14 TO 16 AND COMPARATIVE EXAMPLE 2

18 g of each polymer obtained in Synthesis Examples 8 to 10, 2 g of hexamethoxymethylmelamine and 0.5 g of diphenyl iodonium hexafluorophosphate were dissolved in ethoxyethyl propionate to obtain a 10% solution and the resulting solution was filtered through a Teflon-made microfilter having a pore size of 0.10 μm to prepare a bottom anti-reflective coating solution. This coating solution was coated on a silicon wafer by means of a spinner and heated on a vacuum contact system hot plate at 170° C. for 3 minutes to form a bottom anti-reflective coating. (Hexamethoxymethyl melamine as the thermal cross-linking agent was not added to the compound of Synthesis Example 8 (Compound (40)).)

In the same manner, a bottom anti-reflective coating solution was prepared from the polymer obtained in Synthesis of Comparative Example 2.

EXAMPLES 17 TO 19

Bottom anti-reflective coating solutions of Examples 17 to 19 were prepared in the same manner as in Examples 14 to 16 except for using 2.0 g of hexamethylol form of Tris P-PA (produced by Honshu Chemical Industry Co., Ltd.) in place of hexamethoxymethylmelamine in Examples 14 to 16.

The bottom anti-reflective coating solutions of Examples 17 to 19 each was filtered through a Teflon-made microfilter having a pore size of 0.10 μm, coated on a silicon wafer by means of a spinner and heated on a vacuum contact system hot plate at 170° C. for 3 minutes to form a bottom anti-reflective coating.

EXAMPLE 20

A bottom anti-reflective coating containing the polymer Compound (44) obtained in Synthesis Example 11 was formed in the same manner as in Examples 14 to 16 except for using cyclohexanone as the solvent in place of ethoxyethyl propionate.

The bottom anti-reflective coatings prepared all were regulated to have a thickness of 0.17 μm. Each bottom anti-reflective coating was dipped in a coating solvent used for the resist, such as γ-butyrolactone or ethoxyethyl propionate, and verified to be insoluble in the solvent.

On each bottom anti-reflective coating obtained, ARCH-2 (produced by Fuji Hunt Electronics Technology KK) as a positive photoresist for KrF excimer laser was coated (thickness: 0.85 μm), exposed to light at the wavelength of 248 nm using a reduction projection exposure apparatus (NSR-1505EX, manufactured by Nikon KK), subjected to post exposure baking at 110° C. for 60 seconds, developed with a 2.38% aqueous tetramethylammonium hydroxide solution for 1 minute and then dried for 30 seconds. The thus-obtained resist pattern on the silicon wafer was observed through a scanning type electron microscope and examined on the limiting resolution and the film thickness dependency.

In the measurement of the absorbance at 248 nm, each bottom anti-reflective coating composition was coated on a quartz plate, then dried by heating to form a coating, and the coating was measured by a spectrophotometer UV-240 manufactured by Shimadzu Corporation.

The limiting resolution means a limiting resolution at the exposure amount necessary for reproducing a mask pattern of 0.50 μm when the film thickness is 0.85 μm.

The film thickness dependency as an index for examining the effect of the difference in the film thickness on the sensitivity was evaluated by the ratio of the sensitivity with the resist film thickness of 0.85 μm to the sensitivity with the film thickness of 0.87 μm. A value closer to 1.0, namely, the lower dependency, is preferred.

In determining the dry etching rate, each anti-reflective coating composition was coated on a silicon wafer and dried by heating to form a coating and the coating obtained was measured under the condition of $CF_4/O_2$ by means of CSE-1110 manufactured by ULVAC Japan, Ltd.

The evaluation results are shown in Table 2 below.

TABLE 2

| | Coating Absorbance at 248 nm (/μm) | Limiting Resolution (μm) | Film Thickness Dependency | Dry Etching Rate (Å/min) |
|---|---|---|---|---|
| Example 14 | 8.186 | 0.27 | 0.98 | 574 |
| Example 15 | 7.893 | 0.27 | 0.98 | 666 |
| Example 16 | 7.293 | 0.27 | 0.98 | 666 |
| Example 17 | 7.511 | 0.27 | 0.98 | 549 |
| Example 18 | 8.219 | 0.27 | 0.98 | 553 |
| Example 19 | 7.152 | 0.27 | 0.98 | 553 |
| Example 20 | 7.211 | 0.27 | 0.97 | 698 |
| Comparative Example 2 | 8.037 | 0.27 | 0.97 | 472 |

It is seen from the results above that the bottom anti-reflective coating composition of the present invention has a high coating absorbance, is improved in the limiting resolution of the photoresist, and is reduced in the film dependency of the sensitivity ascribable to the standing wave resulting from the decrease of reflected light from the substrate. On the contrary, in Comparative Example 2, these effects cannot be obtained.

The present invention provides a composition for a bottom anti-reflective coating material and an image formation method which are high in the dry etching rate, high in the resolution and excellent in the resist film thickness dependency, by using a composition for a bottom anti-reflective coating material comprising a naphthalene group-containing polymer having a high dry etching rate and a large absorbance at 248 nm and having a specific structure.

Using the bottom anti-reflective coating material composition and the method for forming a photoresist pattern according to the present invention, there are attained high effect of preventing reflective light against light, no intermixing with the photoresist layer, substantially no dispersion into the photoresist layer on drying by heating and a high dry etching rate as compared with the photoresist, and a fine image with high resolution and low film thickness dependency can be precisely configurated on a predetermined substrate.

While the invention has been described in detail and with reference to specific embodiments thereof, it will be apparent to one skilled in the art that various changes and modifications can be made therein without departing from the spirit and scope thereof.

What is claimed is:

1. A bottom anti-reflective coating material composition comprising a polymer light absorbent having at least one group represented by the following formula (X), (XI), (XII), (XIII), (XIV) or (XV) on the side chain and a thermal cross-linking agent:

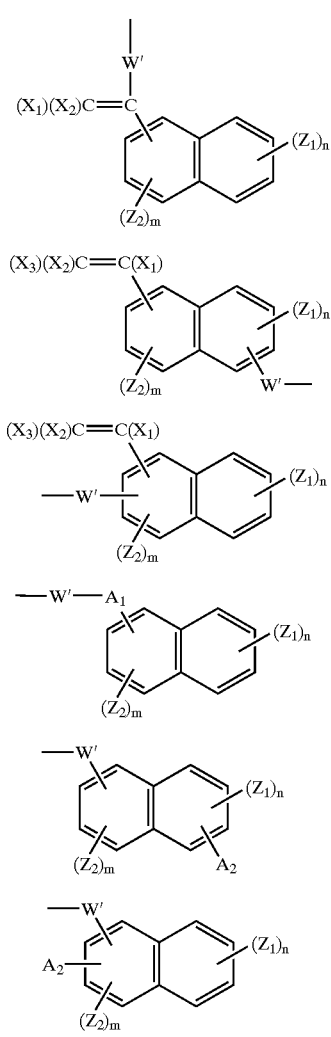

wherein W' represents a divalent linking group, $X_1$ to $X_3$, which may be the same or different, each represents a hydrogen atom, a halogen atom, a cyano group or —$(X_4)_p$—R wherein R represents an alkyl group having from 1 to 20 carbon atoms, an aryl group having from 6 to 20 carbon atoms or an aralkyl group having from 7 to 20 carbon atoms, which may have a substituent, $X_4$ represents a single bond, —$CO_2$—, —CONH—, —O—, —CO—, an alkylene group having from 2 to 4 carbon atoms or —$SO_2$—, p represents an integer of from 1 to 10, $Z_1$ and $Z_2$, which may be the same or different, each represents an electron donating group, m and n represent an integer of from 0 to 2 and from 0 to 3, respectively, and when m is 2 or m and n each is 2 or 3, the $Z_1$ groups or the $Z_2$ groups may be the same or different, $A_1$ represents a divalent aromatic ring or heteroaromatic ring group having from 5 to 14 carbon atoms, which may have a substituent, and $A_2$ represents an aromatic ring or heteroaromatic ring group having from 5 to 14 carbon atoms, which may have a substituent.

2. A bottom anti-reflective coating material composition as claimed in claim 1, wherein $Z_1$ and $Z_2$, which may be the same or different, each represents —OH, —$OR^4$, —$NR^5R^6$ or —$SR^4$ wherein $R^4$ represents a hydrocarbon group having from 1 to 20 carbon atoms, and $R^5$ and $R^6$ each represents a hydrogen atom or a hydrocarbon group having from 1 to 20 carbon atoms.

3. A bottom anti-reflective coating material composition as claimed in claim 1, wherein $A_1$ and $A_2$ each represents a divalent or monovalent group of benzene, naphthalene, anthracene, phenanthrene or thiopene ring, which may have a substituent.

4. A bottom anti-reflective coating material composition as claimed in claim 1, wherein said polymer light absorbent contains from 2 to 50 wt % of the repeating structural unit represented by the following formula (XXVII):

wherein $R_2$ represents a hydrogen atom, a methyl group, a chlorine atom, a bromine atom or a cyano group, and $B_1$ represents a group containing —$CH_2OH$, —$CH_2OR^7$ or —$CH_2OCOCH_3$ at the terminal wherein $R^7$ represents a hydrocarbon group having from 1 to 20 carbon atoms.

5. A bottom anti-reflective coating material composition comprising the following components (a) and (b):

(a) a polymer light absorbent claimed in claim 1; and (b) a melamine, guanamine, glycoluril or urea compound substituted by at least one substituent selected from a methylol group, an alkoxymethyl group and an acyloxymethyl group.

6. A method for forming a resist pattern comprising the steps of:

dissolving a bottom anti-reflective coating material composition of claim 1; in a solvent to provide a bottom anti-reflective coating solution;

coating the bottom anti-reflective coating solution on a substrate to form a bottom anti-reflective coating;

curing the coating;

coating a photoresist on the cured bottom anti-reflective coating;

imagewise-exposing the photoresist to light;

optionally subjecting the photoresist to post-exposure baking; and developing, rinsing and drying the imagewise-exposed photoresist to form a resist pattern.

7. A bottom anti-reflective coating material composition comprising:

a polymer light absorbent having at least one repeating structural unit represented by the following formula (XXIV), (XXV) or (XXVI) and a thermal cross-linking agent:

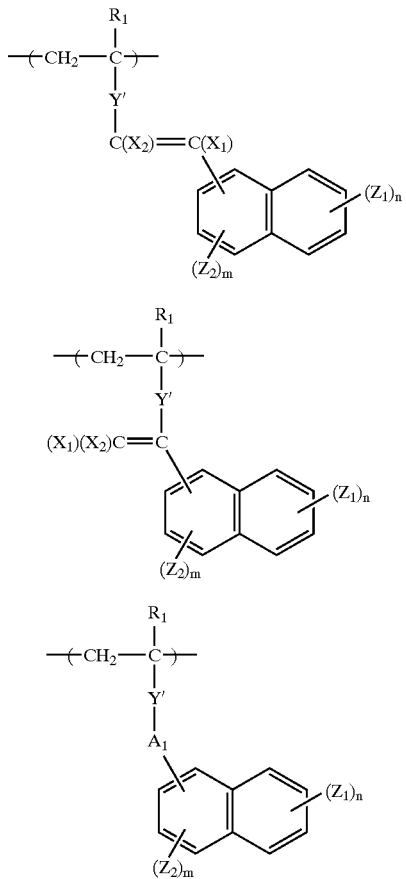

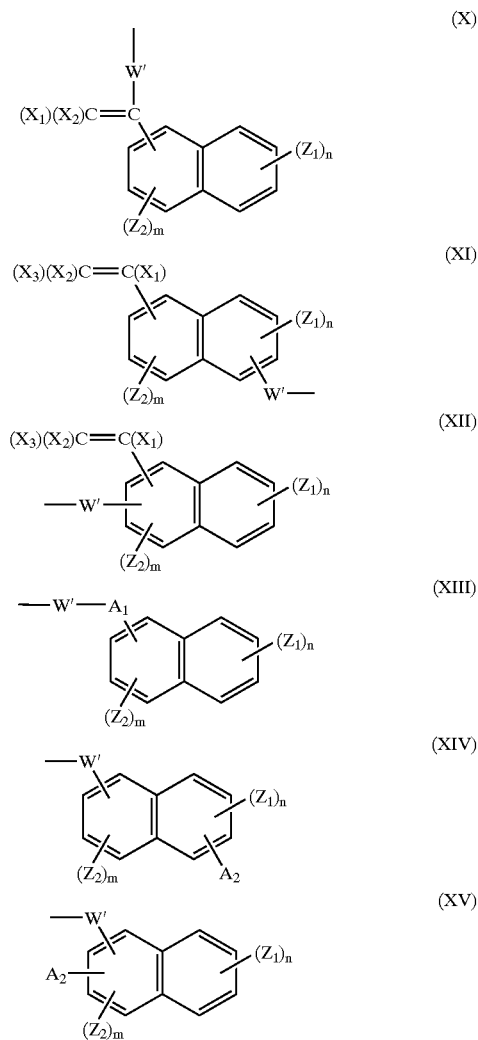

wherein $R^1$ represents a hydrogen atom, a methyl group, a chlorine atom, a bromine atom or a cyano group, Y' in Formulae (XXV) and (XXVI) represents a divalent linking group and Y' in Formulae (XXIV) represents a —$CO_2$—E—, —CONH—E—, —O—E—, —CO—E— or —$SO_2$—E— group, wherein E represents an aromatic ring group having from 6 to 14 carbon atoms, $X_1$ and $X_2$, which may be the same or different, each represents a hydrogen atom, a halogen atom, a cyano group or —$(X_4)_p$—R wherein R represents an alkyl group having from 1 to 20 carbon atoms, an aryl group having from 6 to 20 carbon atoms or an aralkyl group having from 7 to 20 carbon atoms, which may have a substituent, $X_4$ represents a single bond, —$CO_2$—, —CONH—, —O—, —CO—, an alkylene group having from 2 to 4 carbon atoms or —$SO_2$—, p represents an integer of from 1 to 10, $Z_1$ and $Z_2$, which may be the same or different, each represents an electron donating group, m represents an integer of from 0 to 2, n represents an integer of from 0 to 3, and when m is 2 or m and n each is 2 or 3, the $Z_1$ groups or the $Z_2$ groups may be the same or different, $A_1$ represents a divalent aromatic ring or heteroaromatic ring group having from 5 to 14 carbon atoms, which may have a substituent.

8. A bottom anti-reflective coating material composition comprising a polymer light absorbent having at least one group represented by the following formula (X), (XI), (XII), (XIII), (XIV) or (XV) on the side chain:

wherein W' represents a divalent linking group, $X_1$ to $X_3$, which may be the same or different, each represents a hydrogen atom, a halogen atom, a cyano group or —$(X_4)_p$—R wherein R represents an alkyl group having from 1 to 20 carbon atoms, an aryl group having from 6 to 20 carbon atoms or an aralkyl group having from 7 to 20 carbon atoms, which may have a substituent, $X_4$ represents a single bond, —$CO_2$—, —CONH—, —O—, —CO—, an alkylene group having from 2 to 4 carbon atoms or —$SO_2$—, p represents an integer of from 1 to 10, $Z_1$ and $Z_2$, which may be the same or different, each represents an electron donating group, m and n represent an integer of from 0 to 2 and from 0 to 3, respectively, and when m is 2 or m and n each is 2 or 3, the $Z_1$ groups or the $Z_2$ groups may be the same or different, $A_1$ represents a divalent aromatic ring or heteroaromatic ring group having from 5 to 14 carbon atoms, which may have a substituent, and $A_2$ represents an aromatic ring or heteroaromatic ring group having from 5 to 14 carbon atoms, which may have a substituent;

and having from 2 to 50 wt % of a repeating structural unit represented by formula (XXVII):

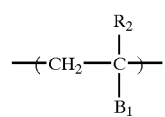 (XXVII)
where $R_2$ represents a hydrogen atom, a methyl group, a chlorine atom, a bromine atom or a cyano group, and $B_1$ represents —CONHCH$_2$OH, —CONHCH$_2$OCH$_3$, or a group obtained by reaction of a group represented by —CONHC(CH$_3$)$_2$CH$_2$COCH$_3$ with formalin.
* * * * *